(12) United States Patent
Liaw

(10) Patent No.: US 9,773,791 B2
(45) Date of Patent: *Sep. 26, 2017

(54) LAYOUT OF STATIC RANDOM ACCESS MEMORY CELL

(71) Applicant: TAIWAN SEMICONDUCTOR MANUFACTURING CO., LTD., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/345,215

(22) Filed: Nov. 7, 2016

(65) Prior Publication Data

US 2017/0179134 A1 Jun. 22, 2017

Related U.S. Application Data

(63) Continuation of application No. 14/974,761, filed on Dec. 18, 2015, now Pat. No. 9,515,077.

(51) Int. Cl.
*H01L 27/11* (2006.01)
*H01L 29/06* (2006.01)
*H01L 29/10* (2006.01)
*H01L 27/02* (2006.01)
(Continued)

(52) U.S. Cl.
CPC ........ *H01L 27/1104* (2013.01); *G11C 11/412* (2013.01); *H01L 27/0207* (2013.01); *H01L 29/1095* (2013.01); *H01L 29/7827* (2013.01)

(58) Field of Classification Search
CPC .................................................. H01L 27/1104
See application file for complete search history.

(56) References Cited

U.S. PATENT DOCUMENTS

7,876,625 B2 1/2011 Yabuuchi et al.
8,605,490 B2 12/2013 Fackenthal
9,515,077 B1 * 12/2016 Liaw .................. H01L 27/1104
(Continued)

OTHER PUBLICATIONS

Notice of Allowance U.S. Appl. No. 14/974,761 dated Aug. 2, 2016.

*Primary Examiner* — Alexander Ghyka
(74) *Attorney, Agent, or Firm* — McDermott Will & Emery LLP

(57) ABSTRACT

A static random access memory (SRAM) cell is defined by first and second boundaries disposed opposite to each other and third and fourth boundaries disposed opposite to each other and intersected by the first and second boundaries. The SRAM cell includes a first invertor including a first P-type pull-up transistor and a first N-type pull-down transistor, a second invertor including a second P-type pull-up transistor and a second N-type pull-down transistor and cross-coupled to the first invertor, and first and second pass-gate transistors connected to the cross-coupled first and second invertors. Source regions of the first and second P-type pull-up transistors are formed by a main source active region extending continuously between the first and second boundaries. Source regions of the first and second pass-gate transistors and the first and second N-type pull-down transistors are formed by different source active regions spaced apart from each other.

20 Claims, 27 Drawing Sheets

(51) Int. Cl.
    *H01L 29/78*  (2006.01)
    *G11C 11/412* (2006.01)

(56) References Cited

U.S. PATENT DOCUMENTS

| | | |
|---|---|---|
| 2008/0180980 A1 | 7/2008 | Huang |
| 2008/0273382 A1 | 11/2008 | Wang |
| 2009/0010053 A1 | 1/2009 | Chiu et al. |
| 2012/0063210 A1 | 3/2012 | Hirabayashi |
| 2013/0175627 A1 | 7/2013 | Goldbach et al. |
| 2015/0055426 A1 | 2/2015 | Chen et al. |
| 2015/0060862 A1 | 3/2015 | Lim et al. |
| 2016/0133633 A1 | 5/2016 | Liaw |
| 2016/0172022 A1 | 6/2016 | Komatsu et al. |

* cited by examiner

LAYOUT OF STATIC RANDOM ACCESS MEMORY CELL

CROSS-REFERENCE TO RELATED APPLICATION

This Application is a Continuation application of U.S. Ser. No. 14/974,761, now U.S. Pat. No. 9,515,077, filed Dec. 18, 2015. The subject matter of which is incorporated herein by reference in entirety.

TECHNICAL FIELD

The present disclosure relates to a layout of a static random access memory (SRAM) cell, and more particularly, to a layout of an SRAM cell having a reduced area.

BACKGROUND

As the semiconductor industry has progressed into nanometer technology process nodes in pursuit of higher device density, higher performance, lower power consumption and lower costs, challenges from both fabrication and design issues have resulted in the development of three-dimensional designs, such as a fin field effect transistor (Fin FET). In a Fin FET device, it is possible to utilize additional sidewalls and to suppress a short channel effect.

Another candidate is a gate-all-around (GAA) device. While a Fin FET device has a fin bottom portion which is not controlled by a gate, in a GAA device, all of the surfaces of the channel layer can be subject to gate control. A GAA device, such as a GAA MOSFET (or MISFET) device, includes a very narrow cylindrical channel body. In particular, a vertical GAA device (VGAA) having a channel extending in a vertical direction (i.e., perpendicular to the substrate) is a promising device as a candidate for low power SRAM applications. In the present disclosure, new layout structures and configurations of an SRAM using a VGAA device with a small unit cell area are provided.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Further, the layout structures shown in the present disclosure are design layouts and do not necessarily show exact physical structures fabricated as a semiconductor device.

Although in the present disclosure, circuit diagrams and layouts of a single static random access memory (SRAM) cell are explained, it should be appreciated that an SRAM generally includes a plurality of SRAM cells arranged in an array. In such an SRAM, wordlines of the SRAM cells in the same row of the array may be connected to each other, bitlines of the SRAM cells in the same column of the array may be connected to each other, and power supply lines of the SRAM cells in the same row or the same column may be connected to each other.

Throughout the entire disclosure, specifying source active region or source region, and drain region is merely to distinguish two heavily doped regions disposed at opposite ends of a channel of a respective transistor. It should be appreciated that source active region or source region, and drain active region or drain region can be interchangeably used, respectively, without altering working principles of the present disclosure.

Figure 2:
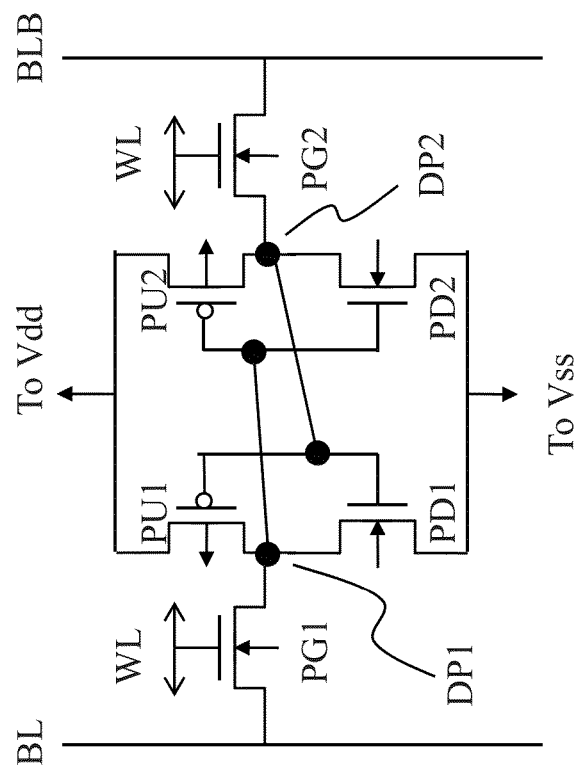
FIGS. 1 and 2 are exemplary circuit diagrams of an SRAM cell according to an embodiment of the present disclosure.
Figure 1:
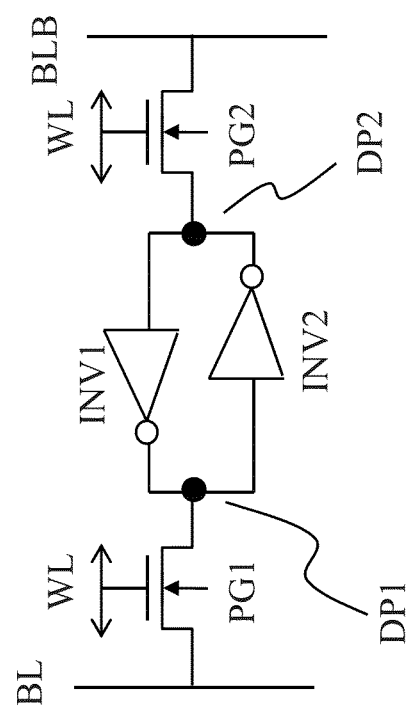

FIGS. 1 and 2 are exemplary circuit diagrams of an SRAM cell according to an embodiment of the present disclosure.

Referring to FIG. 1, an SRAM cell includes two cross-coupled inverters INV1 and INV2. The output of the first inverter INV1 is coupled to the input of the second inverter INV2, and the output of the second inverter INV2 is coupled to the input of the first inverter INV1. The SRAM cell further includes a first pass-gate transistor PG1 coupled to the output of the first inverter INV1 and the input of the second inverter INV2 and a second pass-gate transistor PG2 coupled to the output of the second inverter INV2 and the input of the first inverter INV1. Gate electrodes of the first and second pass-gate transistors PG1 and PG2 are coupled to a wordline WL, a source region of the first pass-gate transistor PG1 is coupled to a bitline BL, and a source region of the second pass-gate transistor PG1 is coupled to a complementary bitline BLB, which is the complement of the bitline BL.

Referring to FIG. 2, the first inverter INV1 includes a first pull-up transistor PU1 and a first pull-down transistor PD1. The second inverter INV2 includes a second pull-up transistor PU2 and a second pull-down transistor PD2. A pull-up transistor is a P-type transistor of which source/drain is connected to a first voltage potential and a pull-down transistor is an N-type transistor of which source/drain is connected to a second power supply voltage lower than the first voltage potential. For example, source regions of the first and second pull-up transistors PU1 and PU2 are connected to a voltage potential Vdd provided by a power supply circuit (not shown) and source regions of the first and second pull-down transistors PD1 and PD2 are connected to another voltage potential Vss lower than Vdd provided by the power supply circuit. Drain regions of the first pull-up transistor PU1, the first pull-down transistor PD1, and the first pass-gate transistor PG1, and gate electrodes of the second pull-up transistor PU2 and the second pull-down transistor PD2, are connected by a data storage node DP1. Drain regions of the second pull-up transistor PU2, the second pull-down transistor PD2, and the second pass-gate transistor PG2, and gate electrodes of the first pull-up transistor PU1 and the first pull-down transistor PD1, are connected by a complementary data storage node DP2. Such features will be more apparent with reference to FIGS. 7, 12A, 12B, and 17 which will be described later.

Figure 3:
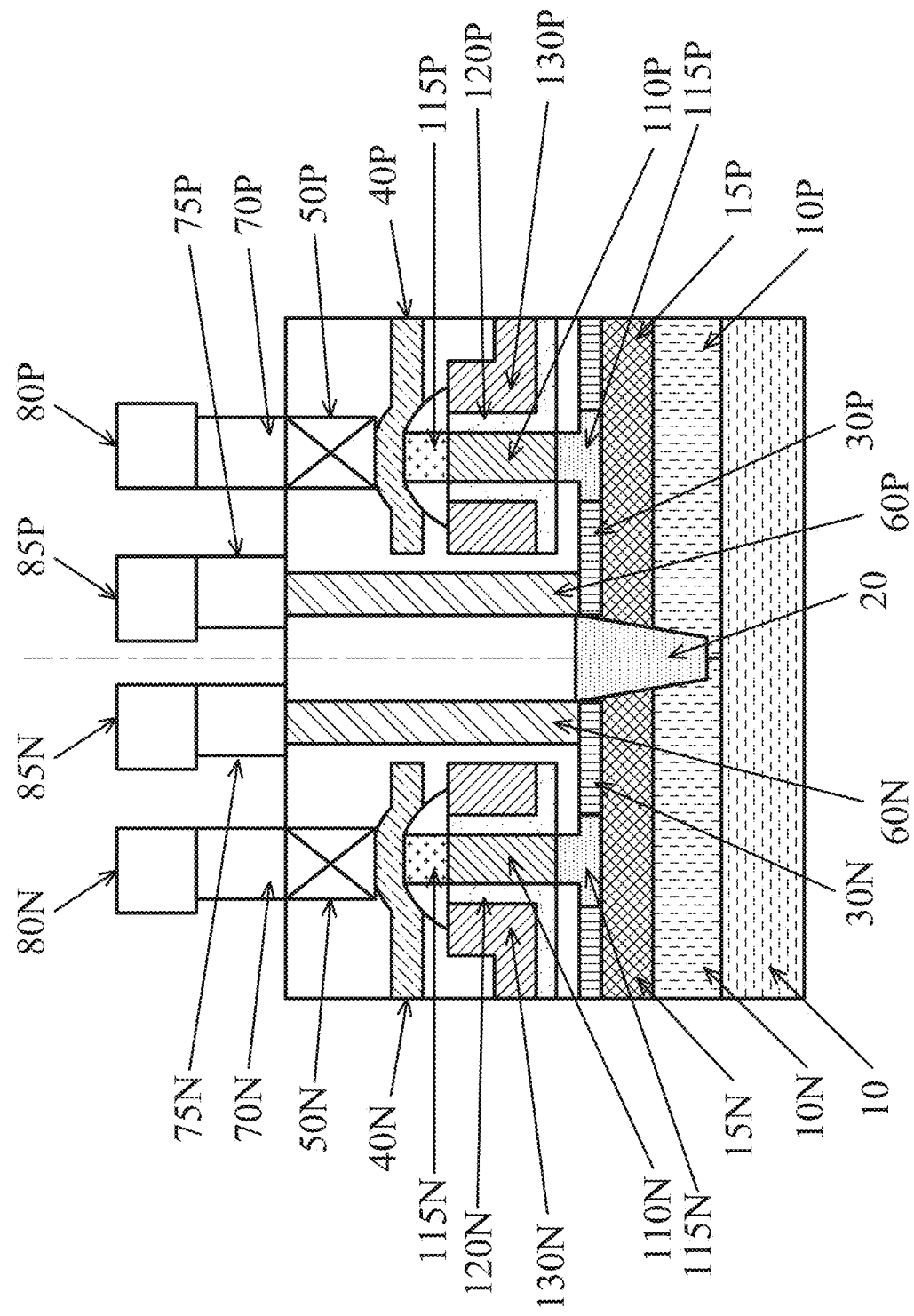
FIG. 3 is an exemplary cross-sectional view of VGAA transistors according to an embodiment of the present disclosure.

FIG. 3 is an exemplary cross-sectional view of VGAA transistors according to an embodiment of the present disclosure. The transistors illustrated in FIG. 3 may be employed to implement the SRAM cell illustrated in FIGS. 1 and 2.

Referring to FIG. 3, an N-type transistor and a P-type transistor are formed on a substrate 10, for example, a silicon substrate. A P-type well 10N and an N-type well 10P are formed in the substrate 10. An N-type source active region 15N and a P-type source active region 15P are formed in the P-type well 10N and the N-type well 10P, respectively. A source active region, of which a source region of a transistor is formed, refers to a diffusion region heavily doped with impurities formed in a top portion of a well in a substrate, and is surrounded by an insulating layer such as a shallow trench isolation (STI). The STI has a trench depth deeper than the source active region but shallower than the well in which the source active region is formed. Adjacent source active regions are separated by the STI interposed therebetween. For example, as shown in FIG. 3, an N-type device region including the P-type well 10N and the N-type source active region 15N is separated by an STI 20 from a P-type device region including the N-type well 10P and the P-type source active region 15P. In some embodiments, silicide layers 30N and 30P are formed on and conterminous to the source active regions 15N and 15P, respectively, except that portions of the silicide layers 30N and 30P are removed so as to form the N-type and P-type transistors. A combination of the N-type source active region 15N and the silicide layer 30N formed thereon, and a combination of the P-type source active region 15P and the silicide layers 30P formed thereon, are referred to bottom plates of the N-type and P-type transistors. According to some embodiments, a germanide layer, instead of silicide layer, may be alternatively formed on a source active region to implement a bottom plate including the source active region and the germanide layer. Although not shown in FIG. 3, two or more transistors having the same type can be formed in the same source active region. Such features will be more apparent with reference to FIGS. 6, 11, and 16 to be described later.

The N-type source active region 15N for the N-type transistor may include an epitaxially-growth material. The epitaxially-growth material may be one or more layers of SiP, SiC, SiPC, Si, Ge, or a III-V material, or any other suitable materials. The P-type active region 15P for the P-type transistor may include an epitaxially-growth material. The epitaxially-growth material may be one or more layers of Si, SiGe, Ge, SiP, SiC or a III-V material, or any other suitable materials.

As illustrated in FIG. 3, channel layer 110N and 110P extend in the vertical direction (the normal direction of the substrate 10) and the carriers (electrons or holes) travels in the channel layers 100N and 110P along the vertical direction. The shape of the channel layer is a wire in nano-meter scale having a substantially uniform diameter. The diameter of the nano-wire is in a range from about 5 nm to about 50 nm in some embodiments, or is in a range from about 10 nm to about 30 nm in other embodiments. The number of nano-wires in one transistor is one or more. According to other embodiments, although not shown in FIG. 3, the shape of the channel layer is a bar-shape in nano-meter scale having a substantially rectangular shape including a pair of longer sides and a pair of shorter sides in a plane parallel to a major surface of the substrate 10. The longer side of the nano-bar is in a range from about 10 nm to about 60 nm in some embodiments, or is in a range from about 20 nm to about 40 nm in other embodiments, and the shorter side is in a range from about 5 nm to about 50 nm in some embodiments, or is in a range from about 10 nm to about 30 nm in other embodiments. When transistors having nano-bar channels are employed in the SRAM cell illustrated in FIG. 2, the shorter-side width of the nano-bar of the first and second pull-down transistors PD1 and PD2 is wider than that of the first and second pull-up transistors PU1 and PU2 by, for example, about 20%, and/or the shorter-side width of the nano-bar of the first and second pass-gate transistors PG1 and PG2 is wider than that of the first and second pull-up transistors PU1 and PU2 by, for example, about 20%.

The material for forming the nano-wire and the nano-bar is Si, Ge, SiGe, SiC, SiP, SiPC, or SiGeB, or a III-V material, or any other suitable materials, with appropriate dopants. The III-V material may be one or more of InP, InAs, GaAs, AlInAs, InGaP, InGaAs, GaAsSb, GaPN and AlPN, or any other suitable materials.

Referring to FIG. 3, the N-type transistor further includes source/drain LDD (lightly doped drain) regions 115N, and a drain region (top plate) 40N. The channel layer 110N is surrounded by a gate dielectric layer 120N, which is further surrounded by a gate electrode layer 130N.

Similarly, the P-type transistor further includes source/drain LDD regions 115P, and a drain region (top plate) 40P. The channel layer 110P is surrounded by a gate dielectric layer 120P, which is further surrounded by a gate electrode layer 130P.

The source region or source active region and drain region of the N-type transistor may include one or more dopants such as P, As, Sb, N or C, or any other suitable elements. The source region or source active region and drain region of the P-type transistor may include one or more dopants such as B, In, N or C, or any other suitable elements.

According to some embodiments, although not shown in FIG. 3, the N-type and P-type transistor may further include one or more layers of Si, Ti-based silicide, Co-based silicide, Ni-based silicide, Pt-based silicide, TiN, TaN, W, Cu, Al, or combination thereof, or any other suitable materials formed on the drain regions 40N and 40P, together with the drain regions 40N and 40P to form top plates.

The drain region 40N is connected to a first metal wiring 80N through a plate contact 50N and a first via 70N. A contact bar 60N is provided to connect the N-type source active region 15N through the silicide layer 30N and a second via 75N that is further connected to a second metal wiring 85N. The drain region 40P is connected to a first metal wiring 80P through a plate contact 50P and a first via 70P. A contact bar 60P is provided to connect the P-type source active region 15P through the silicide layer 30P and a second via 75P that is further connected to a second metal wiring 85P. The plate contacts 50N and 50P are made of one or more layer of Cu, W, Al, AlCu, TiN, TiW, Ti, Co, Ni, TaN, Ta, or any other suitable metals, or combination thereof. The vias 70N, 70P, 75N, and 75P and the metal wirings 80N, 80P, 85N, and 85P are made of one or more layers of Cu, W, Al, AlCu, TiN, TiW, Ti, Co, Ni, TaN, Ta, or any other suitable metals, or combination thereof. It should be appreciated that contact and via may be interchangeably used in the present disclosure.

The material for the gate electrode layer may be poly-Si, poly-Si with silicide, Al, Cu, W, Ti, Ta, TiN, TaN, TiW, WN, TiAl, TiAlN, TaC, TaCN and TiSiN, or any other suitable materials.

In certain embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, one or more work function adjustment layers (not shown) may be interposed between the gate dielectric layer and the gate electrode layer. The work function adjustment layers are made of a conductive material such as a single layer of TiN, TaN, TaAlC, TiC, TaC, Co, Al, TiAl, HfTi, TiSi, TaSi, NiSi, PtSi or TiAlC, or any other suitable materials, or a multilayer of two or more of these materials.

As described above, the channel layers 110N and 110P of the N-type and P-type transistors illustrated in FIG. 3 are vertically formed on the substrate 10 and are surrounded by the gate electrode layers 130N and 130P. Accordingly, such transistors, which may be employed to implement the SRAM cell of FIG. 2, are vertical gate-all-around (VGAA) transistors.

Figure 4:
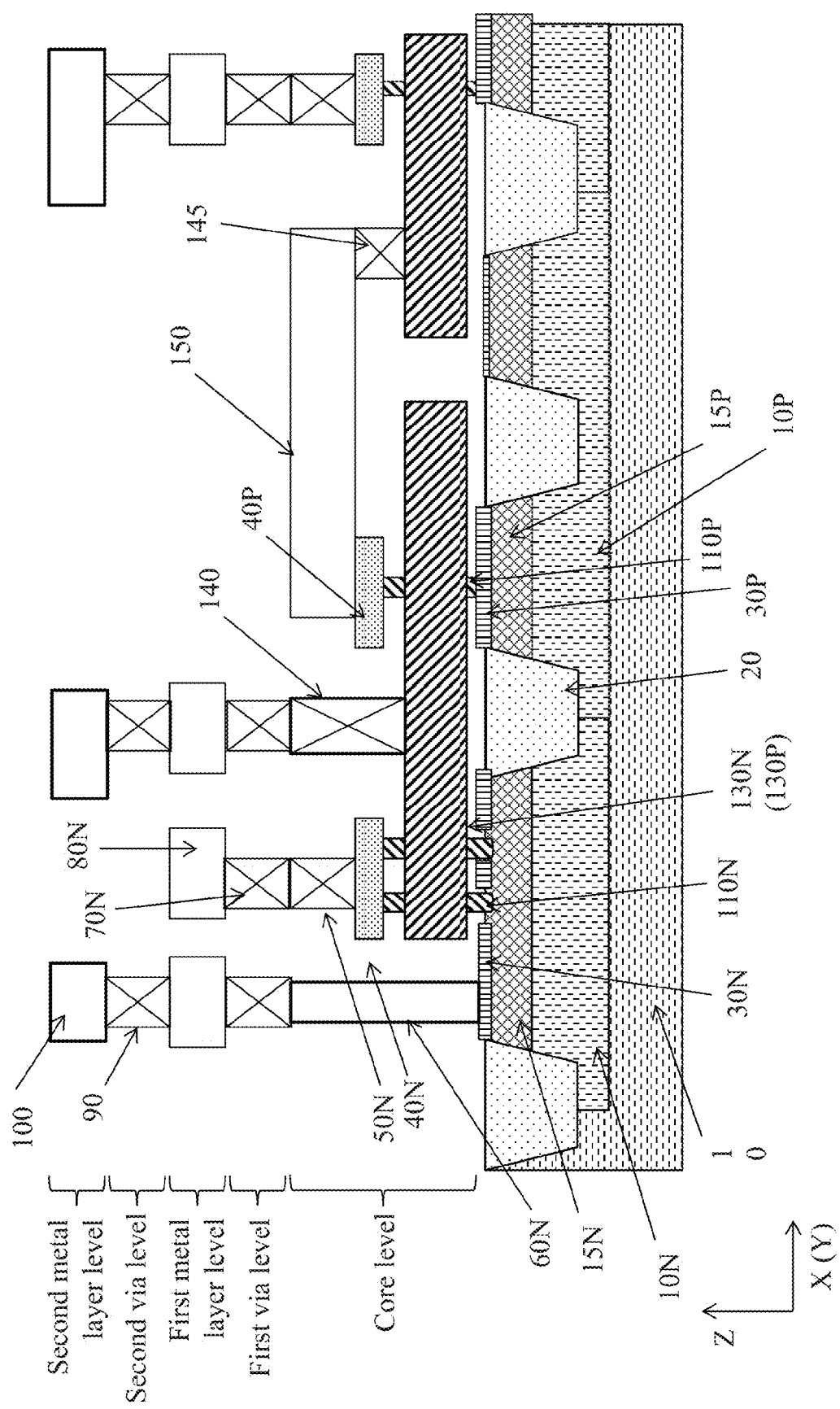
FIG. 4 is an exemplary cross-sectional view schematically illustrating a vertical layer arrangement of transistors according to an embodiment of the present disclosure.

FIG. 4 is an exemplary cross-sectional view schematically illustrating a vertical layer arrangement of components according to an embodiment of the present disclosure. In the following description, components the same as those described in the embodiment with reference to FIG. 3 will be denoted by the same reference numerals, and a redundant description will be omitted.

Referring to FIG. 4, in the substrate level, the substrate 10, and the wells 10N and 10P are disposed. In the core level, the source active regions 15N and 15P, the silicide layers 30N and 30P, the channel layers 110N and 110P, the gate electrode layers 130N (130P), the drain regions (top plates) 40N and 40P, the plate contacts 50N, and the contact bars 60N are disposed. The core level also includes a gate contact 140. Further, a local connection structure including a gate contact 145 and a local connection layer 150 is disposed in the core level. In the first via level, the first vias 70N are disposed. In the first metal layer level, the first metal wirings 80N are disposed. In the second via level, the second vias 90 are disposed. In the second metal layer level, the second metal wirings 100 are disposed.

Figure 5:
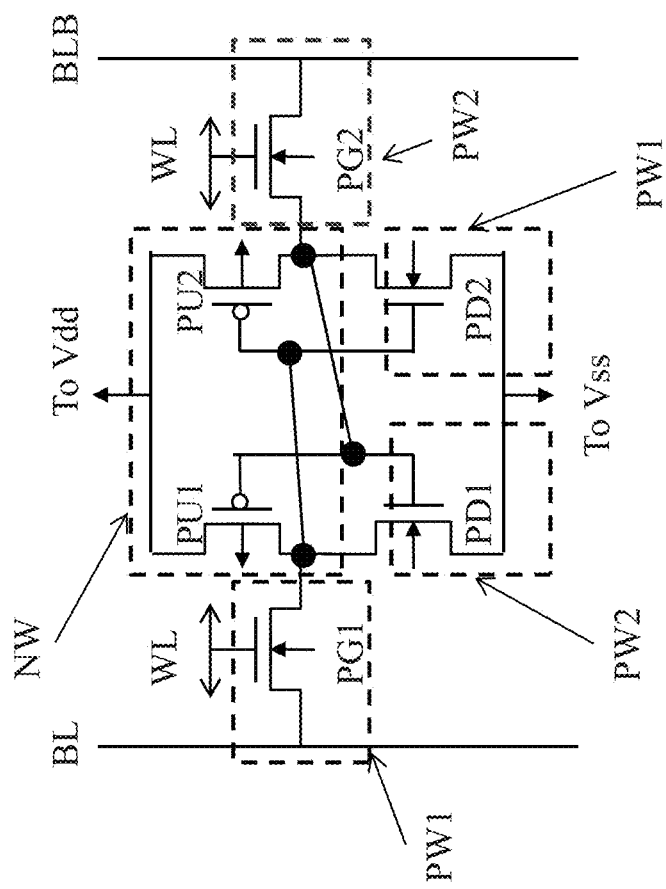
FIG. 5 is an exemplary circuit diagram of an SRAM cell according to an embodiment of the present disclosure.

FIG. 5 is an exemplary circuit diagram of an SRAM cell according to an embodiment of the present disclosure. It should be appreciated that the aforementioned N-type VGAA transistors and P-type VGAA transistors and the aforementioned vertical layer arrangement of the VGAA transistors of FIGS. 3 and 4 may be employed in the present embodiment.

Referring to FIG. 5, an SRAM cell includes first and second pass-gate transistors PG1 and PG2, first and second pull-up transistor PU1 and PU2, and first and second pull-down transistor PD1 and PD2. The first and second pull-up transistors PG1 and PG2 and the first and second pull-down transistors are N-type transistors, which may be implemented by the aforementioned N-type VGAA transistors with reference to FIG. 3. The first and second pull-up transistors PU1 and PU2 are P-type transistors which may be implemented by the aforementioned P-type VGAA transistors with reference to FIG. 3. Vertical layer arrangement of various transistors of the SRAM cell according to the first embodiment may be referred to FIG. 4. Accordingly, some features overlapping those with reference to FIGS. 3 and 4 will be omitted in order to avoid redundancy.

The first pass-gate transistor PG1 and the second pull-down transistor PD2 are formed in the same first P-type well PW1. The second pass-gate transistor PG2 and the first pull-down transistor PD1 are formed in the same second P-type well PW2. The first and second pull-up transistors PU1 and PU2 are formed in the same N-type well NW. Such features will be more apparent with reference to FIG. 6.

Figure 6:
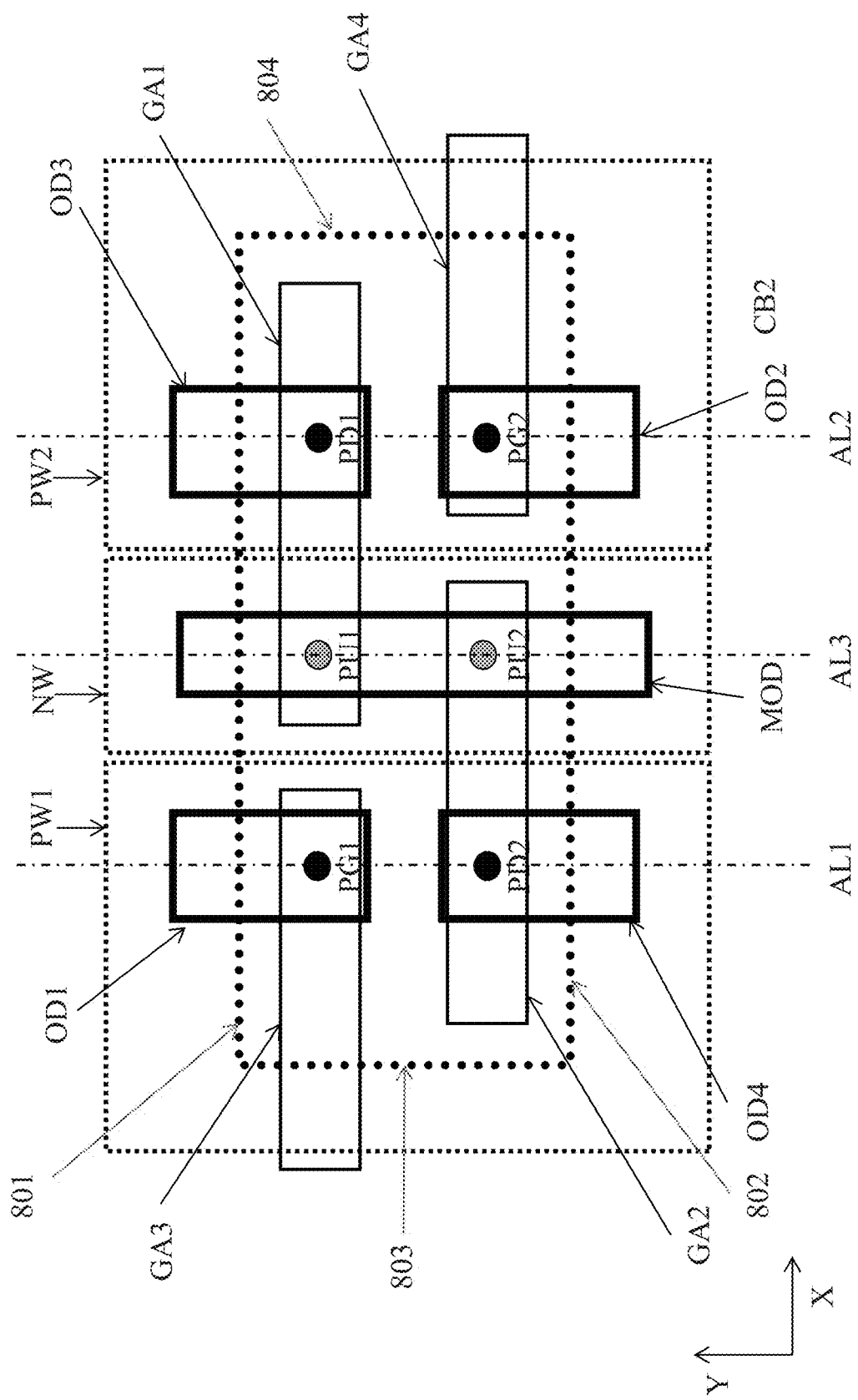
FIG. 6 is a simplified layout of the SRAM cell including source active regions, gate electrodes, and channel layers according to the embodiment illustrated in FIG. 5.

FIG. 6 is a simplified layout of the SRAM cell including source active regions by which source regions are formed), gate electrodes, and channel layers according to the embodiment illustrated in FIG. 5.

Referring to FIG. 6, the SRAM cell includes a main source active region MOD and first through fourth source active region OD1 through OD4 each made of a semiconductor material, such as a Si-based material or a Ge-based material, with heavily doped impurities to form source regions of transistors. Although not included in FIG. 6, similar to the silicide layers 30N and 30P formed over the source active regions 15N and 15P described above with reference to FIGS. 3 and 4, a silicide layers or a germanide layer may be formed over each source active region to form a bottom plate to improve electrical conductivity thereof. The silicide or germanide material may be one or more of Ti, Co, Ni, Mo or Pt or any other suitable elements. It should be appreciated that a silicide layer or germanide layer is conterminous to a respective source active region on which the silicide layer or germanide layer is formed except that a portion or portions of the silicide layer or germanide layer are removed so as to form one or more transistors. In this case, whenever source active regions of adjacent SRAM cells are continuously formed, the corresponding silicide layers or germanide layers are continuously formed. As shown in FIG. 6, the first source active region OD1 and the fourth source active region OD4 are N-type source active regions formed in the first P-type well PW1, the second source active region OD2 and the third source active region OD3 are N-type source active regions formed in the second P-type well PW2, and the main source active region MOD is a P-type source active region formed in the N-type well NW located between the first P-type well PW1 and the second P-type well PW2 in the X direction (row direction).

Source regions of the first and second pull-up transistors PU1 and PU2 are formed by the main source active region MOD and thus are electrically connected to each other through the same main source active region MOD. Source regions of the first pass-gate transistor PG1, the second pass-gate transistor PG2, the first pull-down transistor PD1, and the second pull-down transistor PD2 are formed by the first through fourth source active regions OD1 through OD4, respectively. Although not illustrated in FIG. 6, with reference to FIG. 3, an STI is formed between adjacent source active regions to define boundaries of the source active regions.

The SRAM cell has only three aligning lines parallel to the Y direction (column direction), on which one or two of the source active regions are aligned. The aligning lines are "virtual" lines and there is no physical line in the semiconductor device. The first source active region OD1 and the fourth source active region OD4 are aligned to each other along a first aligning line AL1, the second source active region OD2 and the third source active region OD3 are aligned to each other along a second aligning line AL2, and the main source active region MOD is aligned along a third aligning line AL3 located between the first and second aligning lines AL1 and AL2. In other words, there are three source active region "line-and-space" patterns in the SRAM cell.

Referring to FIG. 6, the SRAM cell has first through fourth boundaries 801 through 804, in which the first and second boundaries 801 and 802 are parallel to the X direction while the third and fourth boundaries 803 and 804 are parallel to the Y direction. Although not illustrated, the SRAM may include a plurality of SRAM cells arranged in an array, in which the boundaries of one cell are directly aligned to the boundaries of adjacent SRAM cells. These features will be more apparent with reference to FIG. 20 to be described later.

In the SRAM cell illustrated in FIG. 6, the main source active region MOD extends continuously between the first and second boundaries 801 and 802. The first source active region OD1 and the fourth source active region OD4 extend toward each other from the first boundary 801 and the second boundary 802, respectively, and are separated from each other by an STI (not shown in FIG. 6), and similarly, the second source active region OD2 and the third source active region OD3 extend toward each other from the second boundary 802 and the first boundary 801, respectively, and are separated from each other by an STI (not shown in FIG. 6).

In FIG. 6, the width (along the X direction) of the main source active region MOD is smaller than the widths of the first through fourth source active regions OD1 through OD4. However, the widths of the main source active region MOD and the first through fourth source active regions OD1 through OD4 may be the same in some embodiments. In another embodiment, the width of the main source active region MOD may be larger than the widths of the first through fourth source active regions OD1 through OD4. Yet in other embodiments, the widths of the first through fourth source active regions OD1 through OD4 may be different.

Still referring to FIG. 6, the SRAM cell includes four gate electrode layers. Portions of a first gate electrode layer GA1 acts as gate electrodes of the first pull-up transistor PU1 and the first pull-down transistor PD1. Portions of a second gate electrode layer GA2 acts as gate electrodes of the second pull-up transistor PU2 and the second pull-down transistor PD2. A portion of a third gate electrode layer GA3 acts as a gate electrode of the first pass-gate transistor PG1 and a portion of a fourth gate electrode layer GA4 acts as a gate electrode of the second pass-gate transistor PG2. The first and third gate electrode layers GA1 and GA3 are aligned to each other in the X direction, and the second and fourth gate electrode layers GA2 and GA4 are aligned to each other in the X direction.

Figure 7:
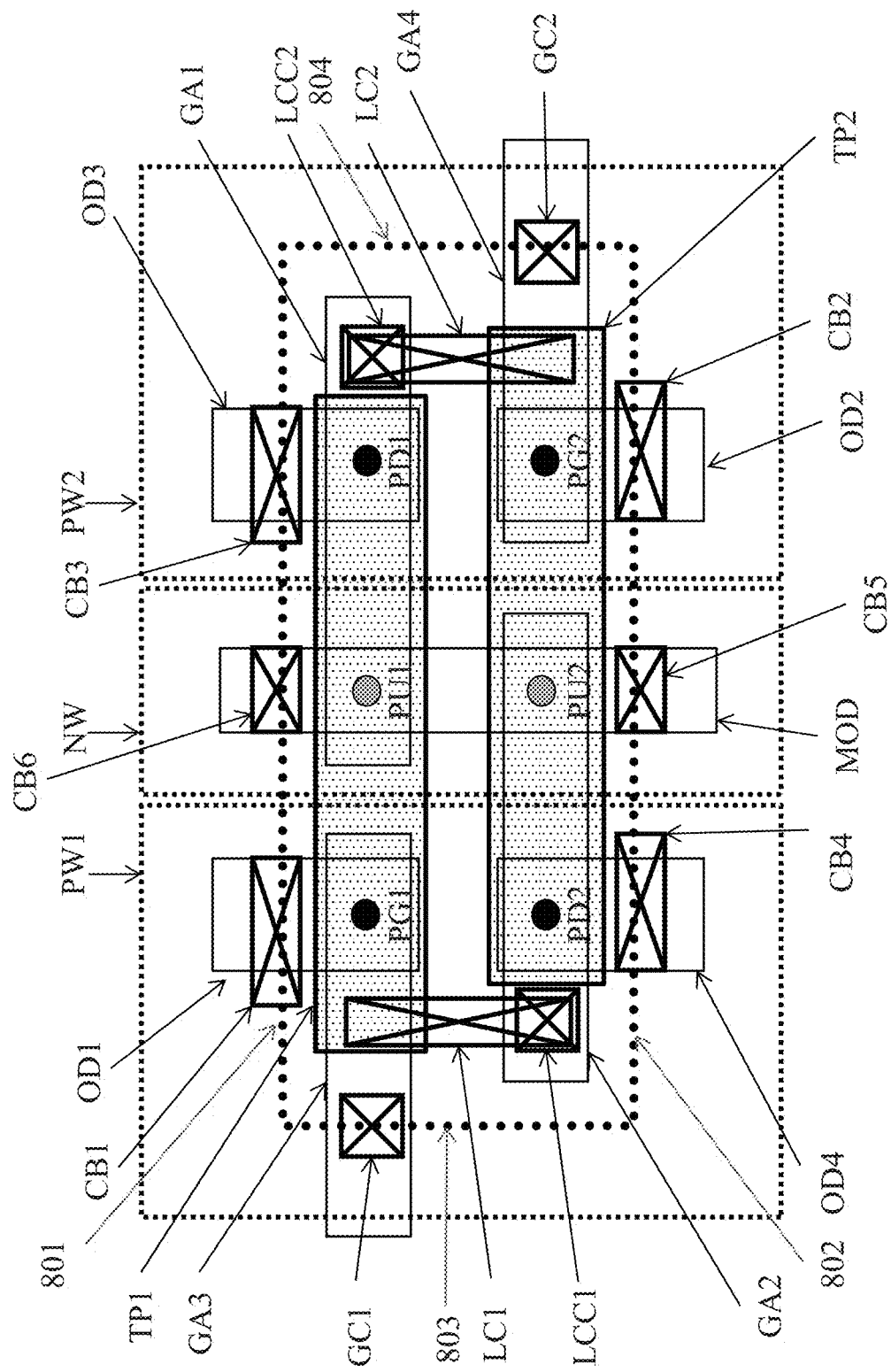
FIG. 7 is a layout of the SRAM cell of FIG. 6, additionally illustrating local connection structures and top plate layers.

FIG. 7 is a layout of the SRAM cell of FIG. 6, additionally illustrating local connection structures and top plate layers.

As shown in FIG. 7, drain regions of the first pull-up transistor PU1, the first pull-down transistor PD1, and the first pass-gate transistor PG1 are formed by a first top plate layer TP1 and drain regions of the second pull-up transistor PU2, the second pull-down transistor PD2, and the second pass-gate transistor PG2 are formed by a second top plate layer TP2. Each of the first and second top plate layers TP1 and TP2 may have a rectangular shape in a plane parallel to a major surface of the substrate on which the SRAM cell is formed. Each of the first and second top plate layers TP1 and TP2 is formed of a heavily doped semiconductor layer and may further include one or more layers of Si, Ti-base silicide, Co-base silicide, Ni-base silicide, Pt-base silicide, TiN, TaN, W, Cu or Al, or any other suitable materials formed over the heavily doped semiconductor layer.

The SRAM cell further includes a first local connection structure electrically connecting the second gate electrode layer GA2 and the first top plate layer TP1, and a second local connection structure electrically connecting the first gate electrode layer GA1 and the second top plate layer TP2. The first local connection structure includes a first local connection contact LCC1 disposed on the second gate electrode layer GA2 and a first local connection layer LC1 connecting the first local connection contact LCC1 and the first top plate layer TP1. That is, the second gate electrode layer GA2 is electrically connected to the first top plate layer TP1 by a path from the first local connection contact LCC1 to the first local connection layer LC1. The second local connection structure includes a second local connection contact LCC2 disposed on the first gate electrode layer GA1 and a second local connection layer LC2 connecting the second local connection contact LCC2 and the second top plate layer TP2. That is, the first gate electrode layer GA1 is electrically connected to the second top plate layer TP2 by a path from the second local connection contact LCC2 to the second local connection layer LC2. According to some embodiments, the first and second local connection layers LC1 and LC2 serve as first and second data storage nodes of the SRAM cell, respectively. The structures of the first and second local connection structure are similar to the local connection structure including the gate contact 145 and the local connection layer 150 described with reference to FIG. 4, but are not limited thereto. The structures of the first and second local connection structure may include a contact to the top plate layer or one or more conductive elements disposed in the layer(s) above the top plate layer.

FIG. 7 also illustrates a first gate contact GC1 disposed on the third gate electrode layer GA3 and a second gate contact GC2 disposed on the fourth gate electrode layer GA4. The first and second gate contacts GC1 and GC2 are part of an electrical path from the gate electrode layers GA3 and GA4 to a wordline WL (the wordline will be described with reference to FIGS. 8B and 9B), respectively. It should be appreciated that the first and second local connection contacts LCC1 and LCC2 and the first and second gate contacts GC1 and GC2 are formed of the same material and by the same manufacturing process.

As shown in FIG. 7, the SRAM also includes contact bars CB1 through CB4 extending from the first through fourth source active regions OD1 through OD4, respectively, and contact bars CB5 and CB6 extending from the main source active regions MOD. According to some embodiments, when silicide layers (not shown in FIG. 7) are formed over respective source active regions with reference to FIG. 3, the contact bars CB1 through CB4 are connected to the first through fourth source active regions OD1 through OD4 through the respective silicide layers, and the contact bars CB5 and CB6 are connected to the main source active region MOD through the silicide layer formed over the main source active region MOD. The contact bars CB1 through CB6 thus may electrically connect the first through fourth source active regions OD1 through OD4 and the main source active region MOD to metal wirings (the metal wirings will be described with reference to FIGS. 8A and 9A) formed over the various transistors of the SRAM cell. The contact bars CB1 through CB6 may be made of one or more layer of Cu, W, Al, AlCu, TiN, TiW, Ti, Co, Ni, TaN, Ta, or other refractory metal, or combination thereof and by the same manufacturing process.

Figure 8A:
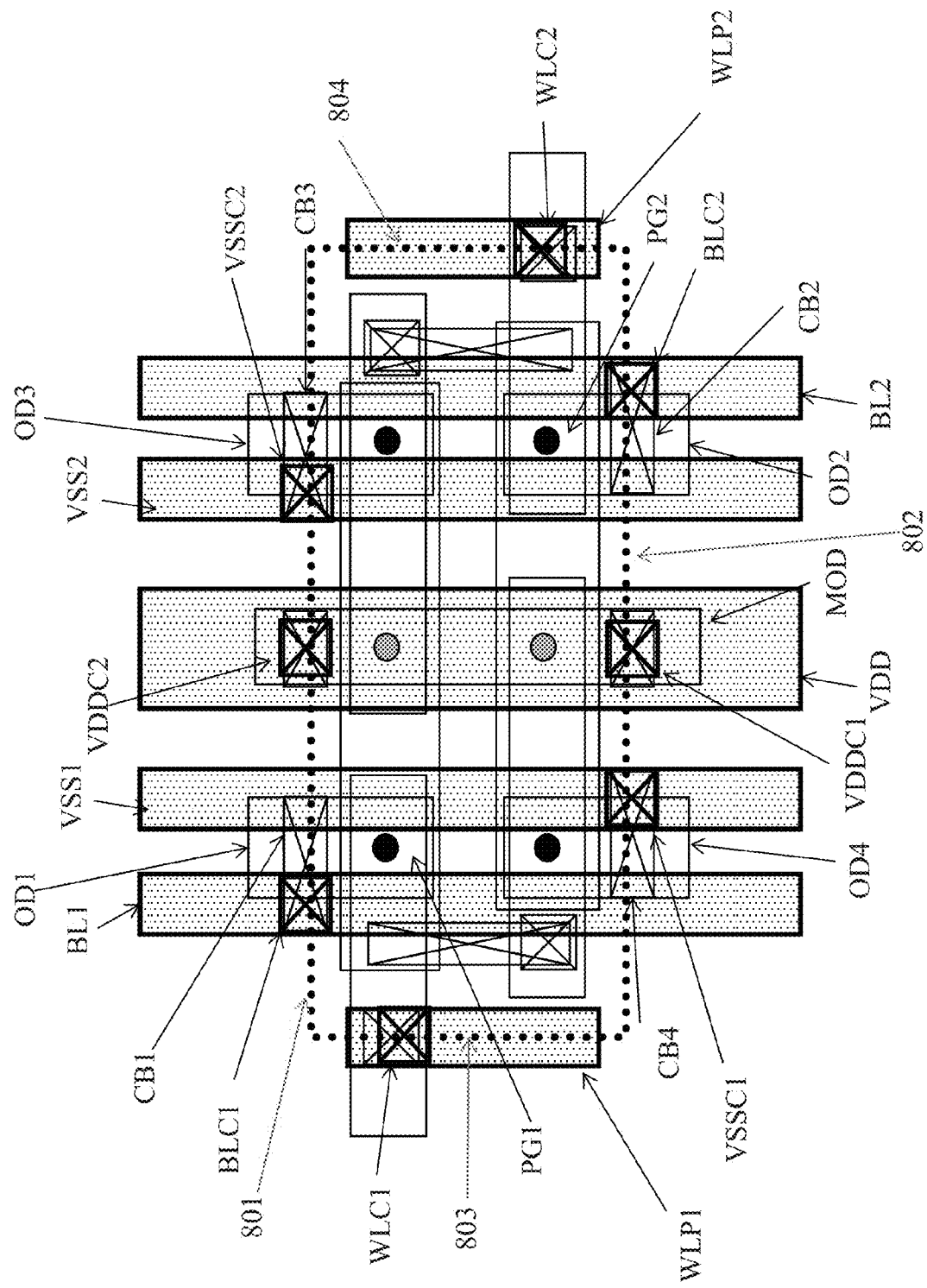
FIGS. 8A and 8B are layouts of the SRAM cell of FIG. 7, additionally illustrating metal wirings and vias.
Figure 8B:
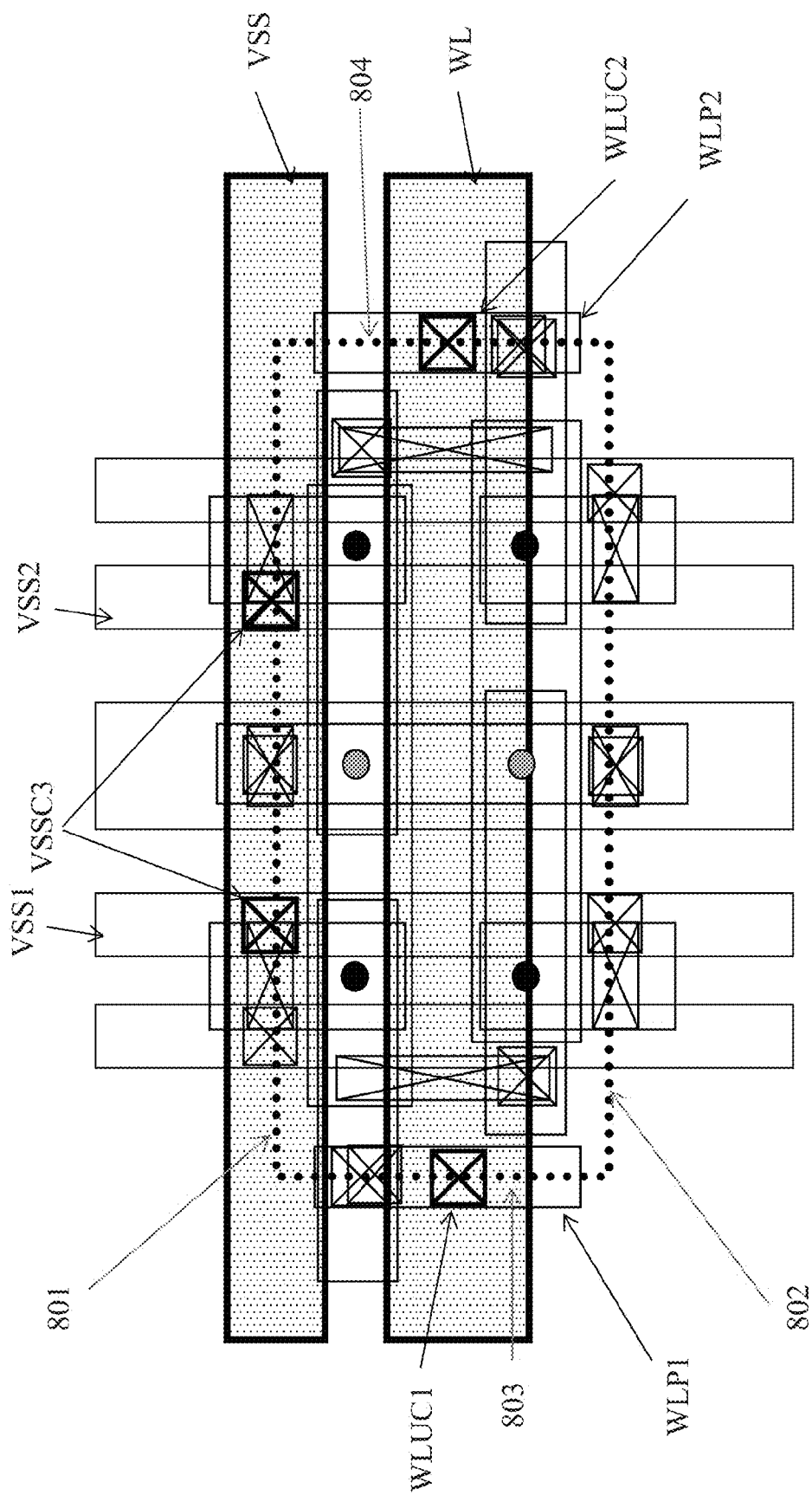

FIGS. 8A and 8B are layouts of the SRAM cell of FIG. 7, additionally illustrating metal wirings and contacts.

Referring to FIG. 8A, the SRAM cell includes a first level of metal wirings including first and second bitlines BL1 and BL2, a first power supply line VDD, first and second auxiliary power supply lines VSS1 and VSS2, and first and second wordline plates WLP1 and WLP2. The first bitline BL1, the first auxiliary power supply line VSS1, the first power supply line VDD, the second auxiliary power supply line VSS2, and the second bitline BL2 are sequentially arranged in the X direction and each extend continuously between the first and second boundaries 801 and 802. The first and second wordline plates WLP1 and WLP2 contact neither the first boundary 801 nor the second boundary 802, and thus, the first and second wordline plates WLP1 and WLP2 are electrically isolated from the wordline plates of adjacent SRAM cells arranged in the same column as the SRAM cell.

Referring to FIGS. 7 and 8A, the main source active region MOD, portions of which act as the source regions of the first and second pull-up transistors PU1 and PU2, is electrically connected to the first power supply line VDD through the contact bars CB5 and CB6 and contacts VDDC1 and VDDC2 which are formed over the contact bars CB5 and CB6, respectively. The first source active region OD1 is electrically connected to the first bitline BL1 through the contact bar CB1 and contact BLC1 which is formed over the contact bar CB1. The second source active region OD2 is electrically connected to the second bitline BL2 through the contact bar CB2 and contact BLC2 which is formed over the contact bar CB2. The third source active region OD3 is electrically connected to the second auxiliary power supply line VSS2 through the contact bar CB3 and contact VSSC2 which is formed over the contact bar CB3. The fourth source active region OD4 is electrically connected to the first auxiliary power supply line VSS1 through the contact bar CB4 and contact VSSC1 which is formed over the contact bar CB4. The third gate electrode layer GA3 is electrically connected to the first wordline plate WLP1 through the first gate contact GC1 and a contact WLC1 formed over the first gate contact GC1, and the fourth gate electrode layer GA4 is electrically connected to the second wordline plate WLP2 through the second gate contact GC2 and a contact WLC2 formed over the first gate contact GC2. It should be appreciated that the contacts WLC1, WLC2, BLC1, BLC2, VDDC1, and VDDC2 may be formed of the same material and by the same manufacturing process.

Referring to FIG. 8B, the SRAM cell further includes a wordline WL and a second power supply line VSS formed of metal wirings of a second metal layer above the metal wirings of the first metal layer. The wordline WL and the second power supply line VSS each extend continuously between the third and fourth boundaries 803 and 804.

Now referring to FIGS. 7, 8A, and 8B, the wordline WL is electrically connected to the third and fourth gate electrode layers GA3 and GA4 which respectively act as the gate electrodes of the first and second pass-gate transistors PG1 and PG2, through a contact WLUC1, the first wordline plate WLP1, the contact WLC1, and the contact GC1 and through a contact WLUC2, the second wordline plate WLP2, the contact WLC2, and the contact GC2, respectively. The second power supply line VSS is electrically connected to the third and fourth source active regions OD3 and OD4, portions of which respectively act as the source regions of the first and second pull-down transistors PD1 and PD2, through a contact VSSC3, the first auxiliary power supply line VSS1, the contact VSSC1, and the contact CB4 and through another contact VSSC3, the second auxiliary power supply line VSS2, the contact VSSC2, and the contact CB3, respectively. It should be appreciated that the contacts VSSC3, WLUC1, and WLUC2 are formed between the first level and second level of metal wirings and are formed of the same material and by the same manufacturing process.

The first and second levels of metal wirings are not limited to the above description with reference to FIGS. 8A and 8B, and may be modified according to other embodiments of the present disclosure. Such modifications will be more apparent with reference to FIGS. 9A and 9B which illustrate variations of the metal wirings and contacts of FIGS. 8A and 8B.

Figure 9A:
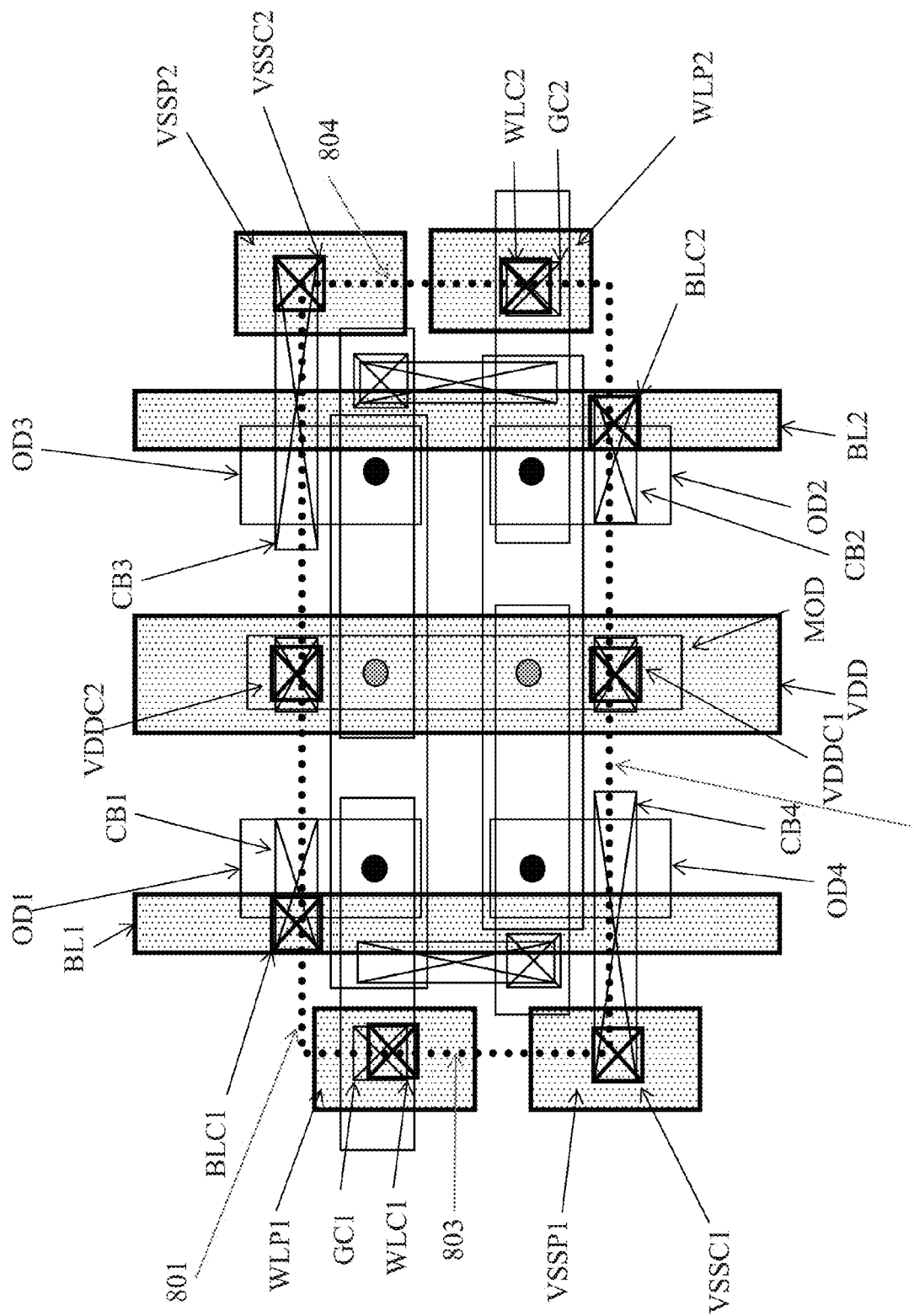
FIGS. 9A and 9B are modified layouts of the SRAM cell illustrated in FIGS. 8A and 8B.
Figure 9B:
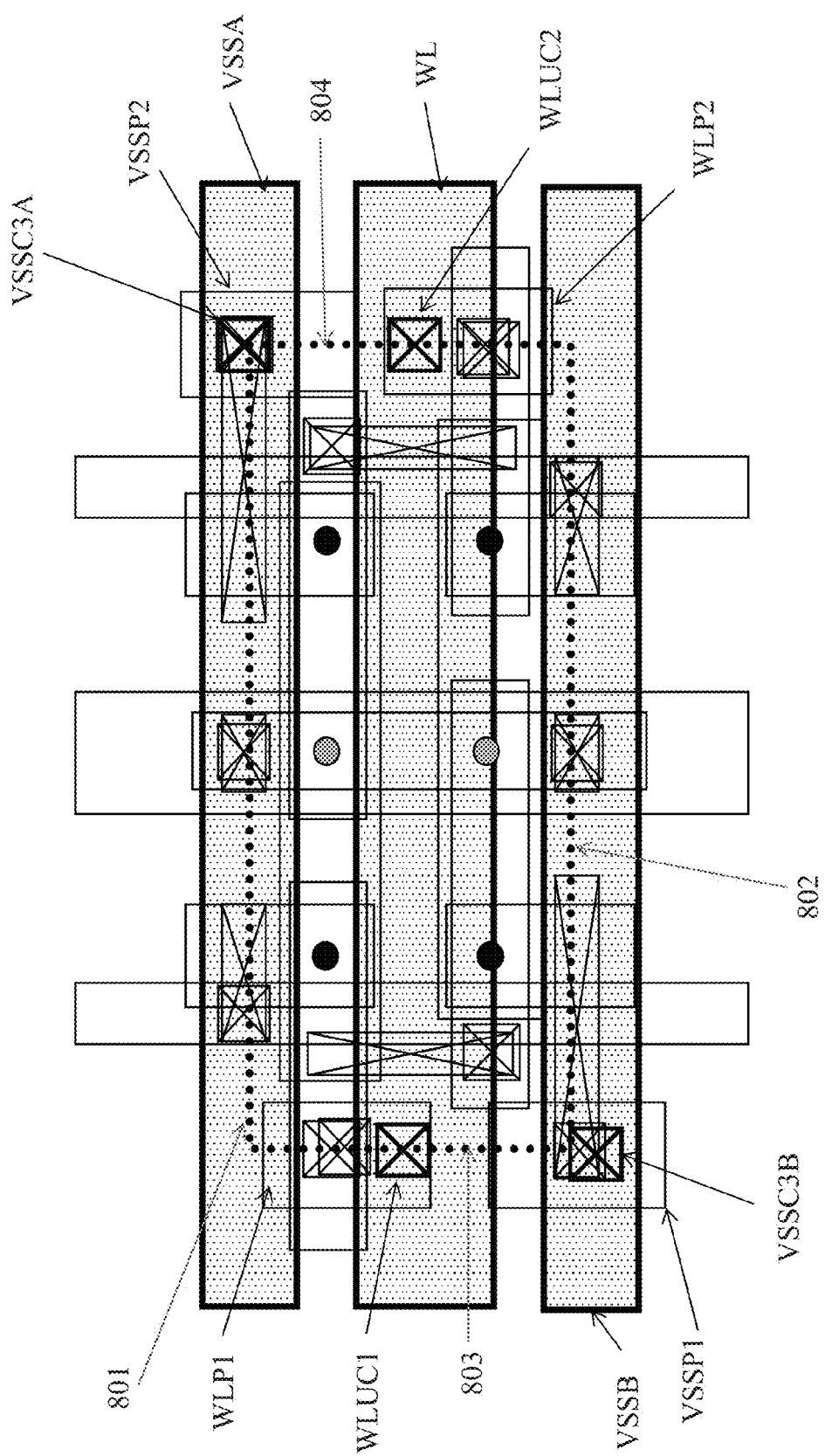

As shown in FIGS. 9A and 9B, the configuration of first and second bitlines BL1 and BL2, a first power supply line VDD, and a wordline WL and their corresponding contacts, is substantially the same as that illustrated in FIGS. 8A and 8B, except that first and second wordline plates WLP1 and WLP2 are relatively shorter than those in FIGS. 8A and 8B. To avoid redundancy, a description of the overlapped features will be omitted.

Referring to FIG. 9A, a contact bar CB4 electrically connected to the fourth source active region OD4 extends further toward the third boundary line 803. A first power line plate VSSP1 formed of the metal wirings of the first metal layer is electrically connected to the contact bar CB4 through a contact VSSC1 formed over the contact bar CB4. The first power line plate VSSP1 may be aligned to the first wordline plate WLP1 in the Y direction. Similarly, a contact bar CB3 electrically connected to the third source active region OD3 extends further toward the fourth boundary line 804. A second power line plate VSSP2 formed of the metal wirings of the first metal layer is electrically connected to the contact bar CB3 through a contact VSSC2 formed over the contact bar CB3. The second power line plate VSSP2 may be aligned to the second wordline plate WLP2 in the Y direction. It should be appreciated that the first and second power line plate VSSP1 and VSSP2 are formed of the same material and by the same manufacturing process as the first and second bitlines BL1 and BL2, the first power supply line VDD, and the first and second wordline plates WLP1 an WLP2. It should also be appreciated that the contacts VSSC1 and VSSC2 are formed of the same material and by the same manufacturing process as the contacts WLC1, WLC2, BLC1, BLC2, VDDC1 and VDDC2.

Now turning to FIG. 9B, the SRAM cell includes a pair of second power supply lines VSSA and VSSB electrically connected to the first and second power line plates VSSP1 and VSSP2 through contacts VSSC3A and VSSC3B, respectively. The contacts VSSC3A and VSSC3B are formed of the same material and by the same process as the contacts WLUC1 and WLUC2.

As described above, the first power supply line VDD, formed of the metal wirings of the first metal layer, is electrically connected to the main source active region MOD portions of which act as the source regions of the first and second pull-up transistors PU1 and PU2. The first and second bitlines BL1 and BL2, formed of the metal wirings of the first metal layer, is electrically connected to the first and second source active regions OD1 and OD2 portions of which respectively act as the source regions of the first and second pass-gate transistors PG1 and PG2. The wordline WL, formed of the metal wirings of the second metal layer, is electrically connected to the third and fourth gate electrode layers GA3 and GA4 portions of which respectively act as the gate electrodes of the first and second pass-gate transistors PG1 and PG2. The second power supply line VSS, which may be formed of the metal wirings of the second metal layer, is electrically connected to third and fourth source active regions OD3 and OD4 portions of which respectively act as the source regions of the first and second pull-down transistors PD1 and PD2; alternately, the pair of second power supply line VSSA and VSSB, which may be formed of the metal wirings of the second metal layer, are respectively electrically connected to third and fourth source active regions OD3 and OD4 portions of which respectively act as the source regions of the first and second pull-down transistors PD1 and PD2. The first top plate layer TP1, portions of which act as the drain electrodes of the first pass-gate transistor PG1, the first pull-up transistor PU1, and the first pull-down transistor PD1, is electrically connected to the second gate electrode layer GA2 portions of which act as the gate electrodes of the second pull-up transistor PU2 and the second pull-down transistor PD2, through the local structure formed of the first local gate contact LCC1 and the first local connection layer LC1. The second top plate layer TP2, portions of which act as the drain electrodes of the second pass-gate transistor PG2, the second pull-up transistor PU2, and the second pull-down transistor PD2, is electrically connected to the first gate electrode layer GA1 portions of which act as the gate electrodes of the first pull-up transistor PU1 and the first pull-down transistor PD1, through the local structure formed of the second local gate contact LCC2 and the second local connection layer LC2.

Figure 10:
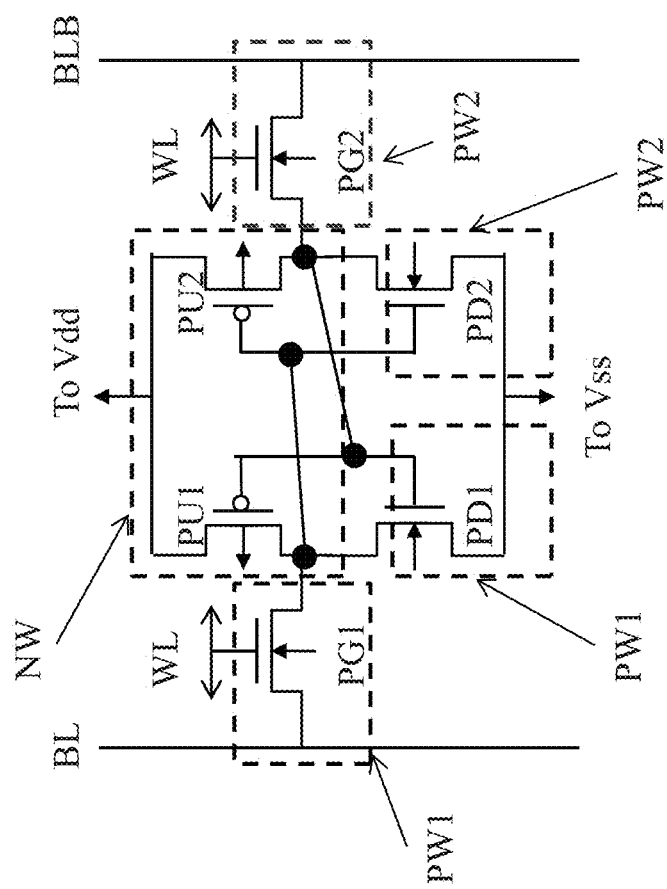
FIG. 10 is an exemplary circuit diagram of an SRAM cell according to an embodiment of the present disclosure.

FIG. 10 is an exemplary circuit diagram of an SRAM cell according to an embodiment of the present disclosure. It should be appreciated that the aforementioned N-type VGAA transistors and P-type VGAA transistors and the aforementioned vertical layer arrangement of the VGAA transistors of FIGS. 3 and 4 may be employed in the present embodiment.

Referring to FIG. 10, an SRAM cell includes first and second pass-gate transistors PG1 and PG2, first and second pull-up transistor PU1 and PU2, and first and second pull-down transistor PD1 and PD2. The first pass-gate transistor PG1 and the first pull-down transistor PD1 are formed in the same first P-type well PW1. The second pass-gate transistor PG2 and the second pull-down transistor PD2 are formed in the same second P-type well PW2. The first and second pull-up transistors PU1 and PU2 are formed in the same N-type well NW. Such features will be more apparent with reference to FIG. 11.

Figure 11:
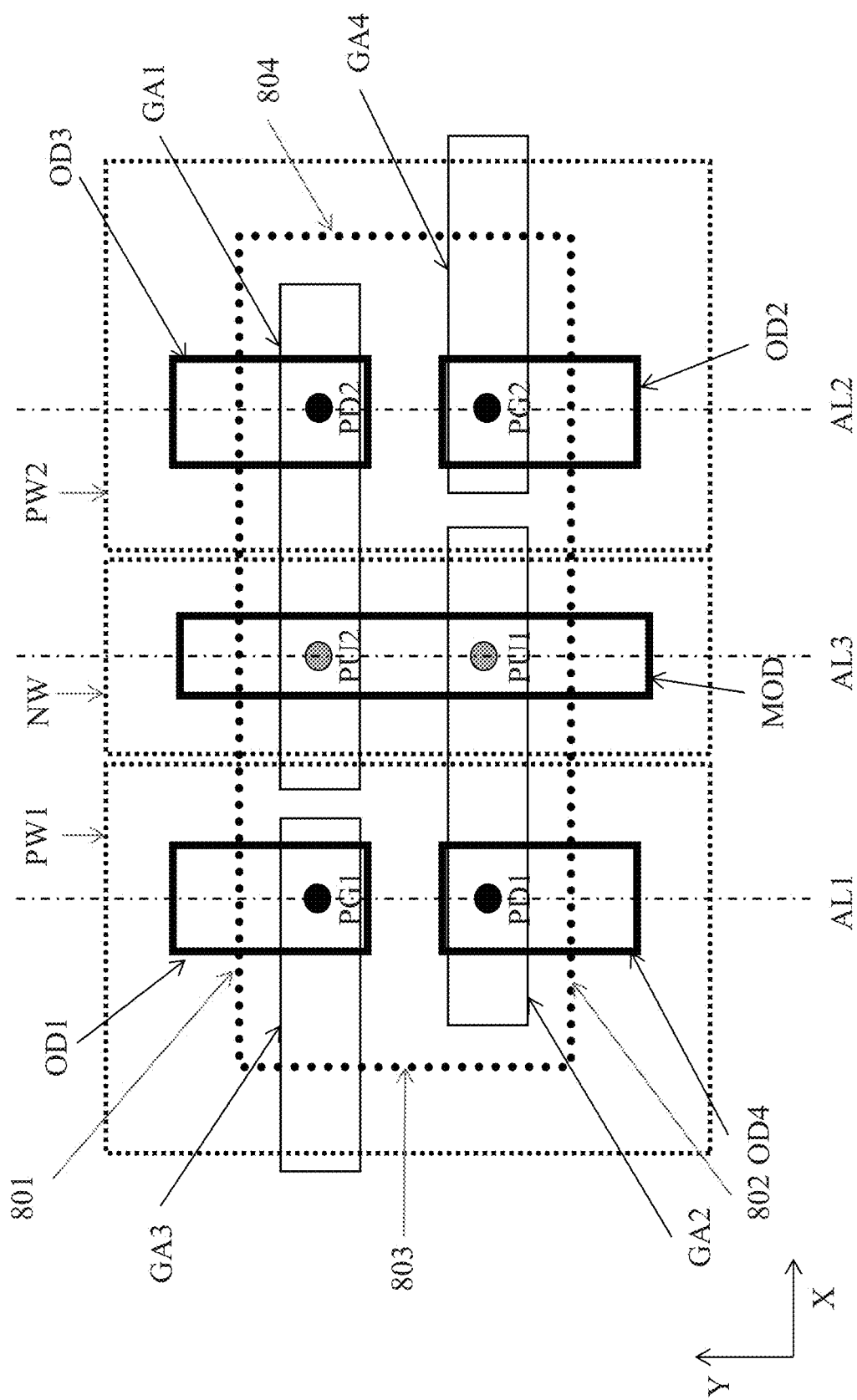
FIG. 11 is a simplified layout of the SRAM cell including source active regions, gate electrodes, and channel layers according to the embodiment illustrated in FIG. 10.

FIG. 11 is a simplified layout of the SRAM cell including source active regions by which source regions are formed, gate electrodes, and channel layers according to the embodiment illustrated in FIG. 10.

Referring to FIG. 11, the SRAM cell includes a main source active region MOD and first through fourth source active region OD1 through OD4 each made of a semiconductor material, such as a Si-based material or a Ge-based material, with heavily doped impurities to form source regions of transistors. Although not included in FIG. 11, similar to the silicide layers 30N and 30P formed over the source active regions 15N and 15P described above with reference to FIGS. 3 and 4, a silicide layers or a germanide layer may be formed over each source active region to form a bottom plate to improve electrical conductivity thereof. The silicide or germanide material may be one or more of Ti, Co, Ni, Mo, or Pt, or any other suitable materials. It should be appreciated that a silicide layer or germanide layer is conterminous to a respective source active region on which the silicide layer or germanide layer is formed except that a portion or portions of the silicide layer or germanide layer are removed so as to form one or more transistors. In this case, whenever source active regions of adjacent SRAM cells are continuously formed, the corresponding silicide layers or germanide layers are continuously formed. As shown in FIG. 11, the first source active region OD1 and the fourth source active region OD4 are N-type source active regions formed in the first P-type well PW1, the second source active region OD2 and the third source active region OD3 are N-type source active regions formed in the second P-type well PW2, and the main source active region MOD is a P-type source active region formed in the N-type well NW located between the first P-type well PW1 and the second P-type well PW2 in the X direction (row direction).

Source regions of the first and second pull-up transistors PU1 and PU2 are formed by the main source active region MOD and thus are electrically connected to each other through the same main source active region MOD. Source regions of the first pass-gate transistor PG1, the second pass-gate transistor PG2, the second pull-down transistor PD2, and the first pull-down transistor PD1 are formed by the first through fourth source active regions OD1 through OD4, respectively. Although not illustrated in FIG. 11, an STI is formed between adjacent source active regions to define boundaries of the source active regions.

The SRAM cell has only three aligning lines parallel to the Y direction (column direction), on which one or two of the source active regions are aligned. The aligning lines are "virtual" lines and there is no physical line in the semiconductor device. The first source active region OD1 and the fourth source active region OD4 are aligned to each other along a first aligning line AL1, the second source active region OD2 and the third source active region OD3 are aligned to each other along a second aligning line AL2, and the main source active region MOD is aligned along a third aligning line AL3 located between the first and second aligning lines AL1 and AL2. In other words, there are three source active region "line-and-space" patterns in the SRAM cell.

Referring to FIG. 11, the SRAM cell has first through fourth boundaries 801 through 804, in which the first and second boundaries 801 and 802 are parallel to the X direction while the third and fourth boundaries 803 and 804 are parallel to the Y direction. Although not illustrated, the SRAM may include a plurality of SRAM cells arranged in an array, in which the boundaries of one cell are directly aligned to the boundaries of adjacent SRAM cells. The configuration of the main source active region MOD and the first through fourth source active regions OD1 through OD4 with reference to the first through fourth boundaries 801 through 804 are the same as that illustrated in FIG. 6; therefore, the overlapped description will be omitted here.

As shown in FIG. 11, the SRAM cell includes four gate electrode layers. Portions of a first gate electrode layer GA1 act as gate electrodes of the second pull-up transistor PU2 and the second pull-down transistor PD2. Portions of a second gate electrode layer GA2 act as gate electrodes of the first pull-up transistor PU1 and the first pull-down transistor PD1. A portion of a third gate electrode layer GA3 acts as a gate electrode of the first pass-gate transistor PG1 and a portion of a fourth gate electrode layer GA4 acts as a gate electrode of the second pass-gate transistor PG2. The first and third gate electrode layers GA1 and GA3 are aligned to each other in the X direction, and the second and fourth gate electrode layers GA2 and GA4 are aligned to each other in the X direction.

Figure 12A:
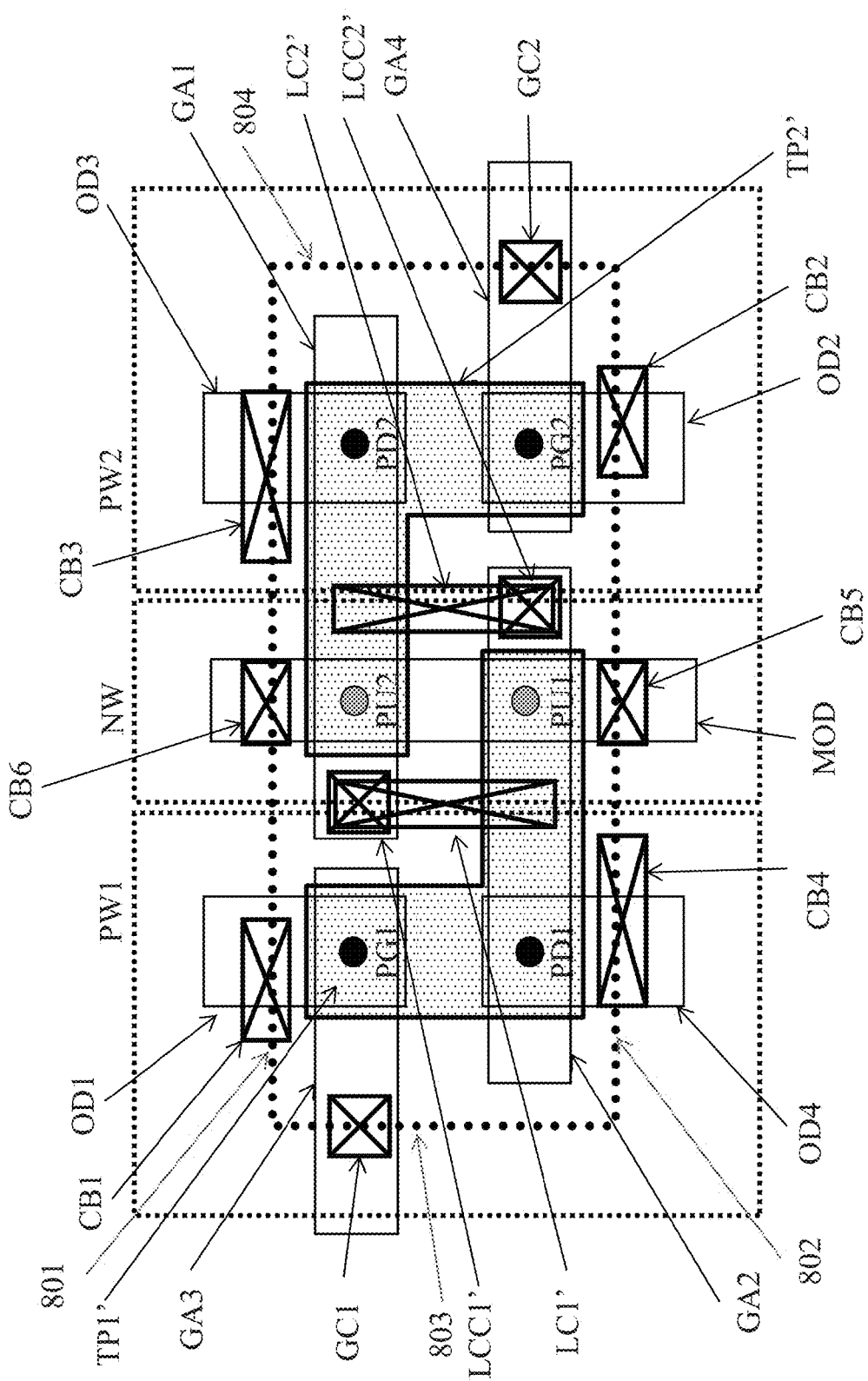
FIG. 12A is a layout of the SRAM cell of FIG. 11, additionally illustrating local connection structures and top plate layers

FIG. 12A is a layout of the SRAM cell of FIG. 11, additionally illustrating local connection structures and top plate layers.

As shown in FIG. 12A, drain regions of the first pull-up transistor PU1, the first pull-down transistor PD1, and the first pass-gate transistor PG1 are formed by a first top plate layer TP1' having an L-shape and drain regions of the second pull-up transistor PU2, the second pull-down transistor PD2, and the second pass-gate transistor PG2 are formed by a second top plate layer TP2' having an L-shape in a plane parallel to a major surface of the substrate on which the SRAM cell is formed. Each of the first and second top plate layers TP1' and TP2' is formed of a heavily doped semiconductor layer and may further include one or more layers of Si, Ti-base silicide, Co-base silicide, Ni-base silicide, Pt-base silicide, TiN, TaN, W, Cu or Al, or any other suitable materials formed over the heavily doped semiconductor layer.

The SRAM cell further includes a first local connection structure electrically connecting the first gate electrode layer GA1 and the first top plate layer TP1', and a second local connection structure electrically connecting the second gate electrode layer GA2 and the second top plate layer TP2'. The first local connection structure includes a first local connection contact LCC1' disposed on the first gate electrode layer GA1 and a first local connection layer LC1' connecting the first local connection contact LCC1' and the first top plate layer TP1'. That is, the first gate electrode layer GA1 is electrically connected to the first top plate layer TP1' by a path from the first local connection contact LCC1' to the first local connection layer LC1'. The second local connection structure includes a second local connection contact LCC2' disposed on the second gate electrode layer GA2 and a second local connection layer LC2' connecting the second local connection contact LCC2' and the second top plate layer TP2'. That is, the second gate electrode layer GA2 is electrically connected to the second top plate TP2' by a path from the second local connection contact LCC2' to the second local connection layer LC2'. The structures of the first and second local connection structure are not limited to the combination of LCC1' and LC1' or LCC2' and LC2'. The structures of the first and second local connection structure may include a contact to the top plate layer or one or more conductive elements disposed in the layer(s) above the top plate layer.

FIG. 12A also illustrates a first gate contact GC1 disposed on the third gate electrode layer GA3 and a second gate contact GC2 disposed on the fourth gate electrode layer GA4, contact bars CB1 through CB4 extending from the first through fourth source active regions OD1 through OD4, respectively, and contact bars CB5 and CB6 extending from the main source active regions MOD. A description of the first and second gate contacts GC1 and GC2, contact bars CB1 through CB6 may be referred to that of the previous embodiment.

The second local connection structure are not limited to the above description with reference to FIG. 12A, and may be modified according to other embodiments of the present disclosure. Such modifications will be more apparent with reference to FIG. 12B.

Figure 12B:
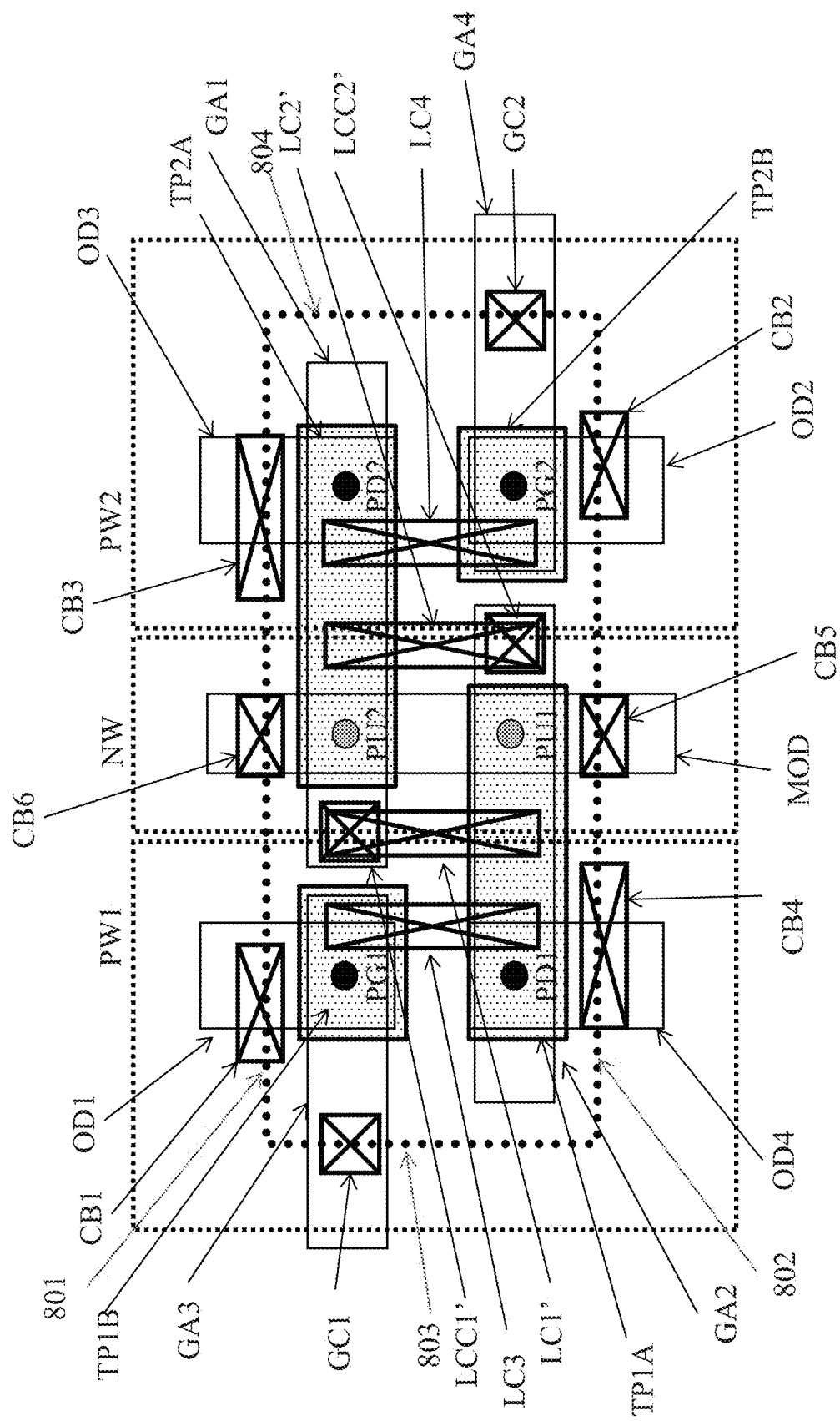
FIG. 12B is a modified layout of the SRAM cell of FIG. 12A.

FIG. 12B is a modified layout of the SRAM cell of FIG. 12A. As shown in FIG. 12B, drain regions of the first pull-up transistor PU1 and the first pull-down transistor PD1 are formed by a first top plate layer TP1A, and a drain region of the first pass-gate transistor PG1 is formed by a second top plate layer TP1B spaced apart from the first top plate layer TP1A. Drain regions of the second pull-up transistor PU2 and the second pull-down transistor PD2 are formed by a third top plate layer TP2A, and a drain region of the second pass-gate transistor PG2 is formed by a fourth top plate layer TP2B spaced apart from the third top plate layer TP2A. The first and fourth top plate layers TP1A and TP2B, each having a rectangular shape, are aligned to each other in the X direction, and the second and third top plate layers TP1B and TP2A, each having a rectangular shape, are aligned to each other in the X direction. Each of the first through top plate layers TP1A, TP1B, TP2A, and TP2B is formed of a heavily doped semiconductor layer and may further include one or more layers of Si, Ti-based silicide, Co-based silicide, Ni-based silicide, Pt-based silicide, TiN, TaN, W, Cu, Al, or combination.

The SRAM cell further includes a first local connection structure electrically connecting the first gate electrode layer GA1 and the first top plate layer TP1A, and a second local connection structure electrically connecting the second gate electrode layer GA2 and the third top plate layer TP2A. A configuration of the first and second first local connection structures is described with reference to FIG. 12A; therefore, an overlapped description is omitted here to avoid redundancy. To electrically connect the first and second top plate layers TP1A and TP1B, a third local connection layers LC3 is formed to bridge the first and second top plate layers TP1A and TP1B. Similarly, to electrically connect the first and second top plate layers TP1A and TP1B, a fourth local connection layer LC4 is formed to bridge the third and fourth top plate layers TP2A and TP2B. The third and fourth local connection layers LC3 and LC4 may be formed of the same material and by the same manufacturing process as the first and second local connection layers LC1' and LC2'.

Figure 13A:
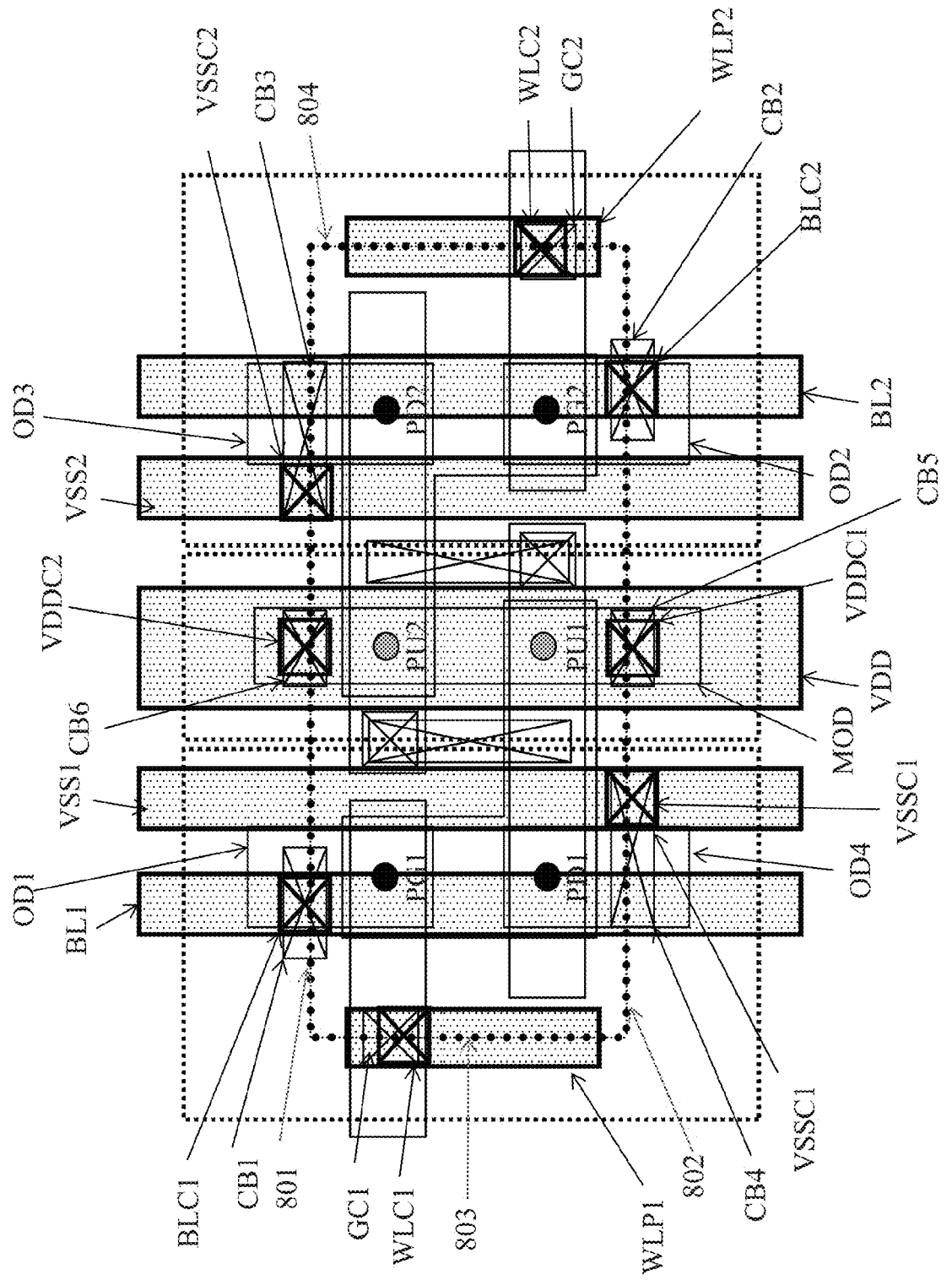
FIGS. 13A and 13B are layouts of the SRAM cell of FIG. 12A, additionally illustrating metal wirings.
Figure 13B:
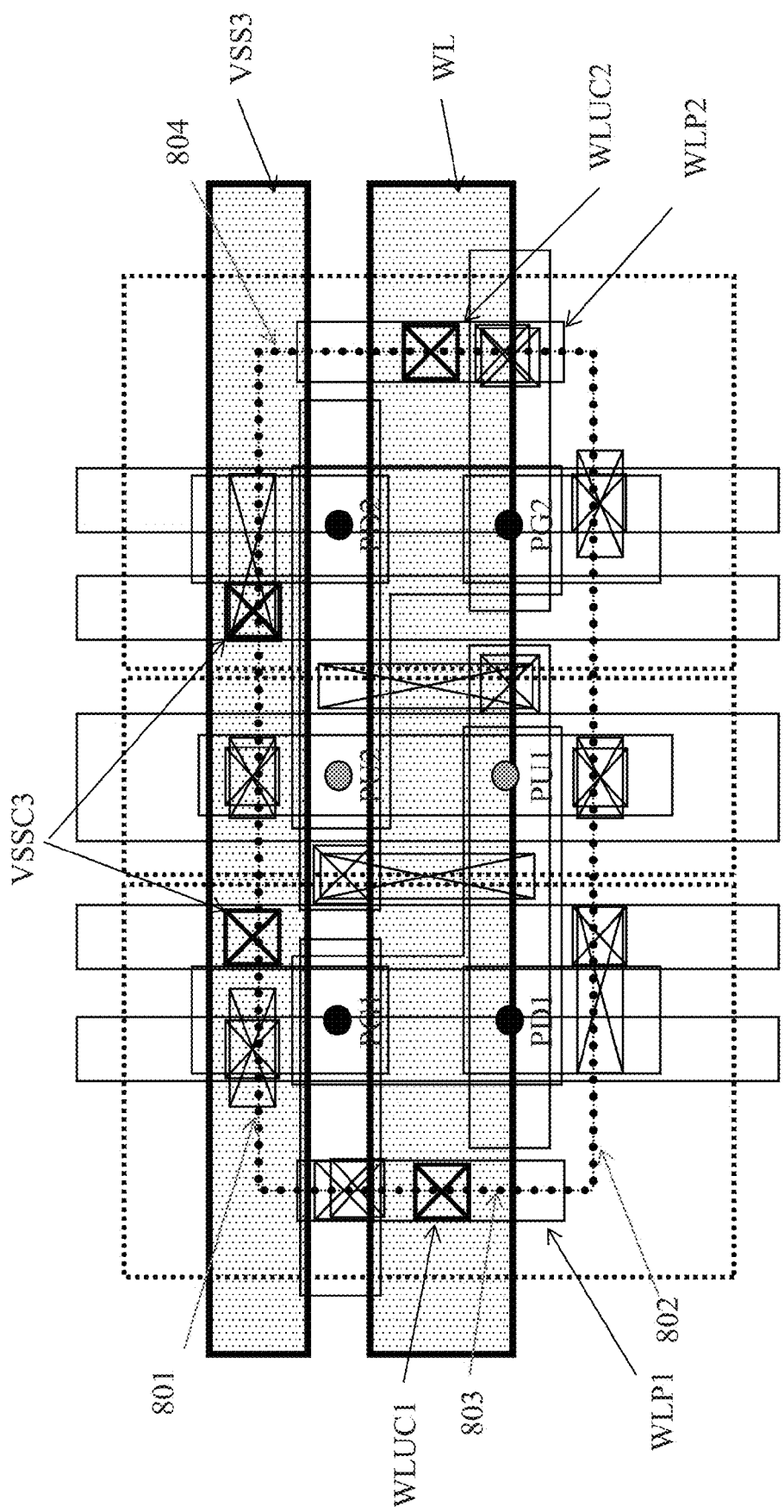

FIGS. 13A and 13B are layouts of the SRAM cell of FIG. 12A, additionally illustrating metal wirings.

Figure 14A:
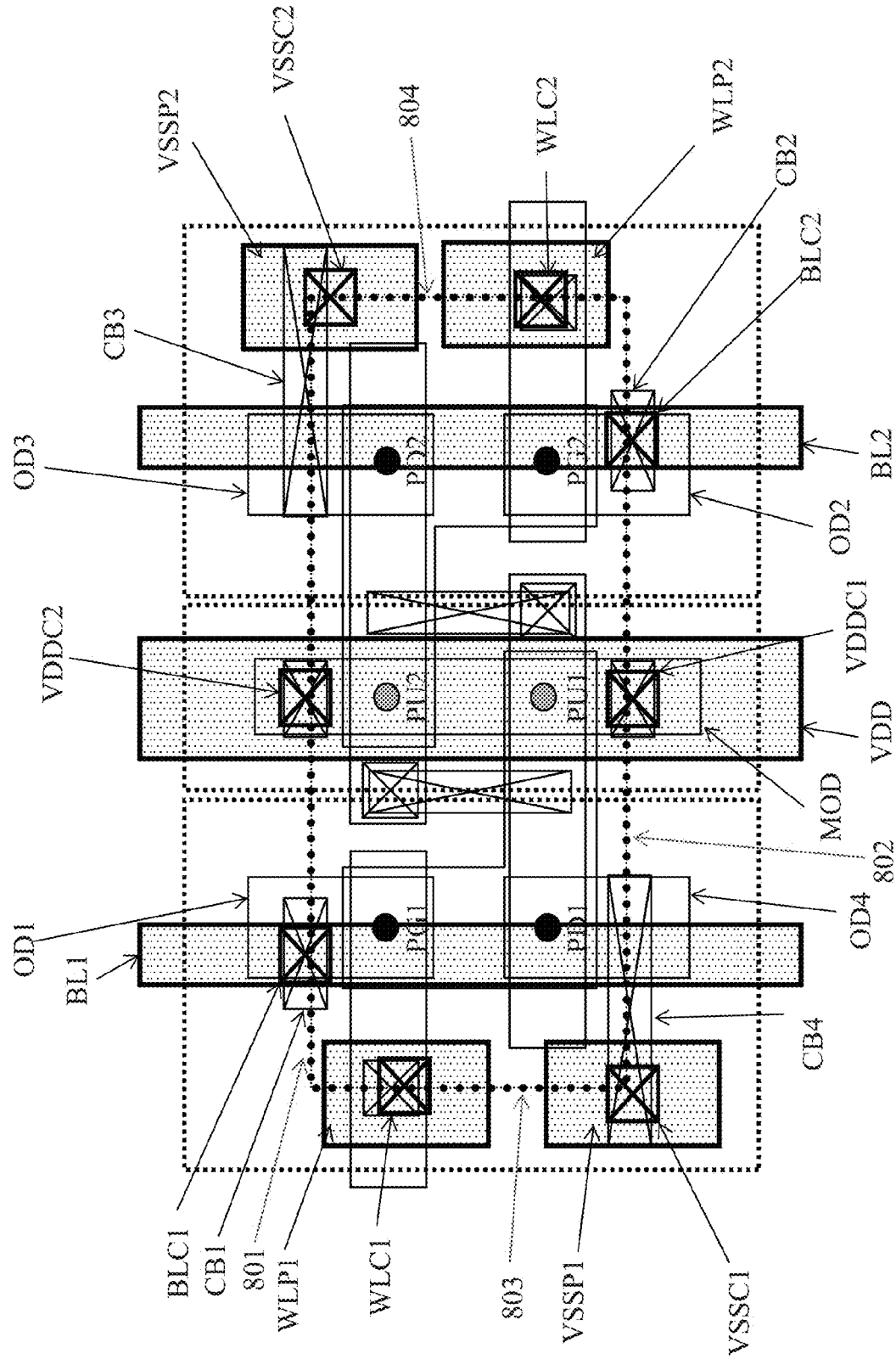
FIGS. 14A and 14B are modified layouts of the SRAM cell illustrated in FIGS. 13A and 13B.
Figure 14B:
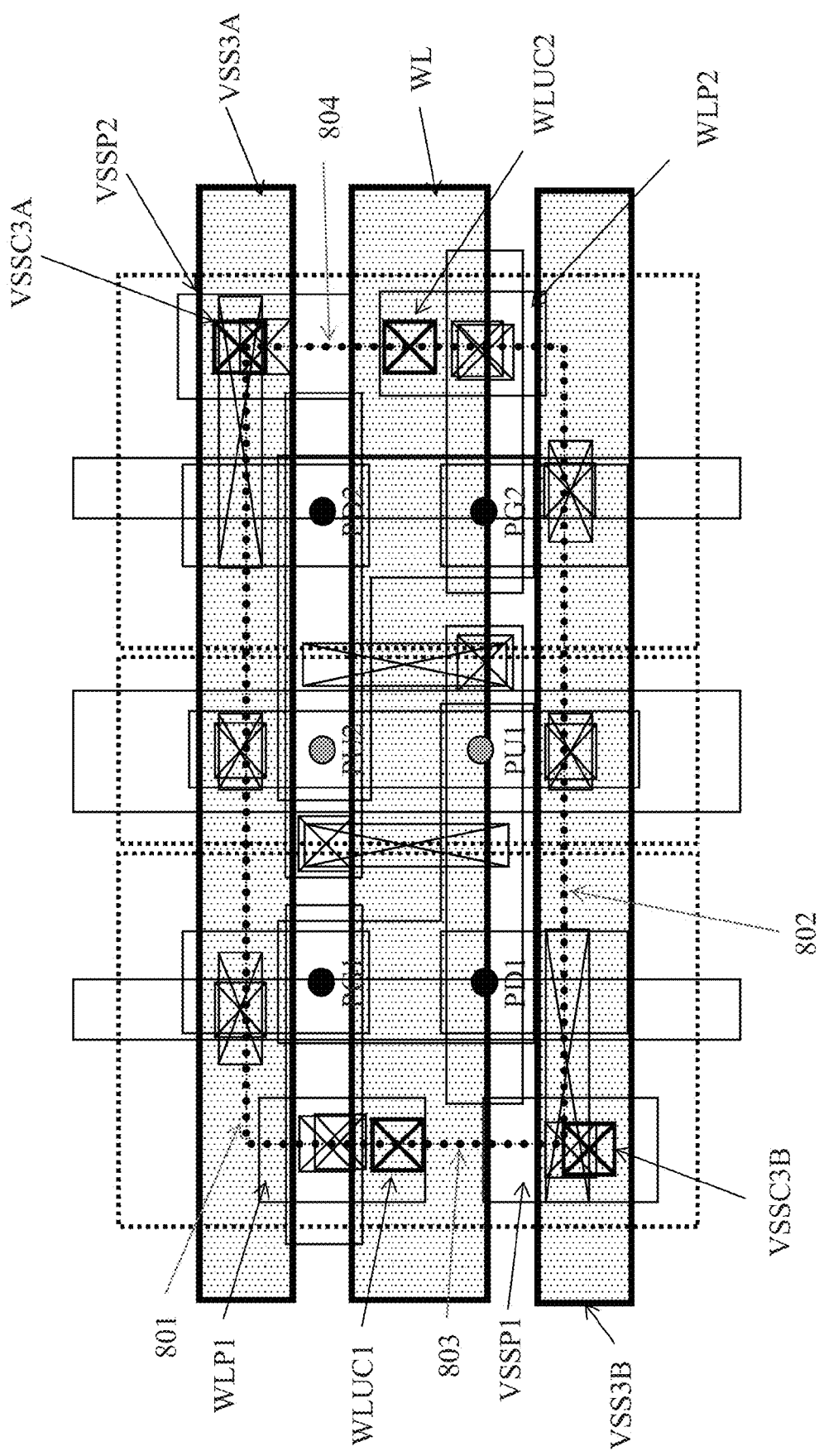

FIGS. 13A and 13B additionally illustrate metal wirings of the SRAM cell according to the second embodiment of the present disclosure, and FIGS. 14A and 14B are modified layouts of the SRAM cell illustrated in FIGS. 13A and 13B. Since the metal wirings illustrated in FIGS. 13A and 13B and FIGS. 14A and 14B according to the present embodiment are substantially the same as those of the previous embodiment. A detailed description of FIGS. 13A and 13B and FIGS. 14A and 14B may refer to that of FIGS. 8A and 8B and FIGS. 9A and 9B, respectively; therefore, the overlapped feature will not repeat here.

As described above, the SRAM cells including N-type first and second pass-gate transistors, according to the aforementioned embodiments and modification based thereon. The present disclosure, however, is not limited thereto. According to other embodiments, P-type transistors may be employed to implement first and second pass-gate transistors. In an embodiment to be described below with reference to FIG. 15, P-type transistors are used to implement the first and second pass-gate transistors.

Figure 15:
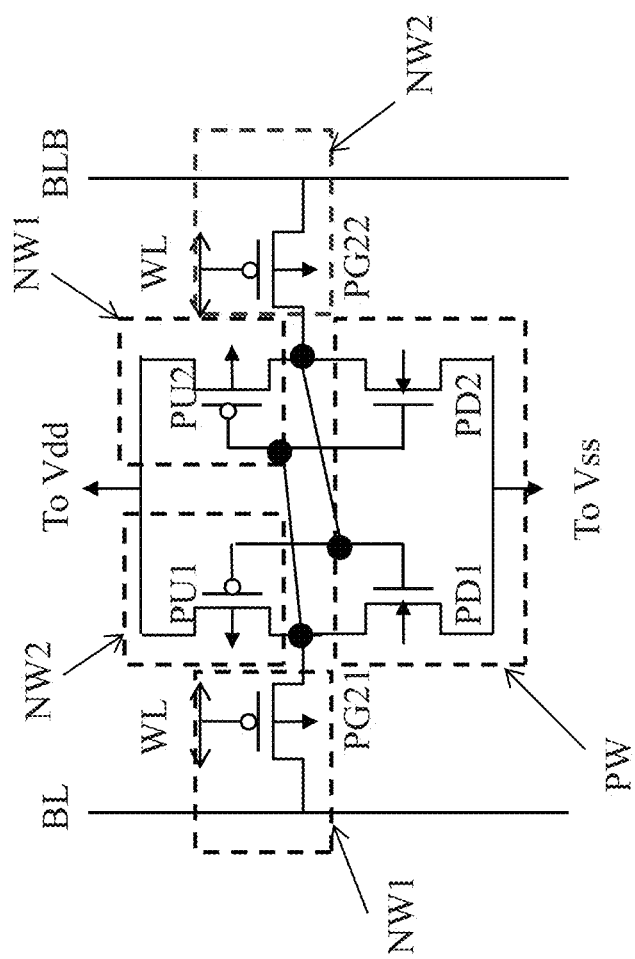
FIG. 15 is an exemplary circuit diagram of a SRAM cell according to an embodiment of the present disclosure.

FIG. 15 is an exemplary circuit diagram of a SRAM cell according to an embodiment of the present disclosure. It should be appreciated that the aforementioned N-type VGAA transistors and P-type VGAA transistors and the aforementioned vertical layer arrangement of the VGAA transistors of FIGS. 3 and 4 may be employed in the present embodiment.

As shown in FIG. 15, an SRAM cell includes first and second pass-gate transistors PG21 and PG22 formed of P-type transistors, first and second pull-up transistor PU1 and PU2, and first and second pull-down transistor PD1 and PD2. To avoid redundancy, only the features different from the aforementioned embodiments with reference to FIGS. 2, 5, and 10 will be described in the following.

The first and second pull-down transistors PD1 and PD2 are formed in the same P-type well PW. The first pass-gate transistor PG21 and the second pull-up transistor PU2 are formed in the same first N-type well NW1. The second pass-gate transistor PG22 and the first pull-up transistor PU1 are formed in the same second N-type well NW2. Such features will be more apparent with reference to FIG. 16.

Figure 16:
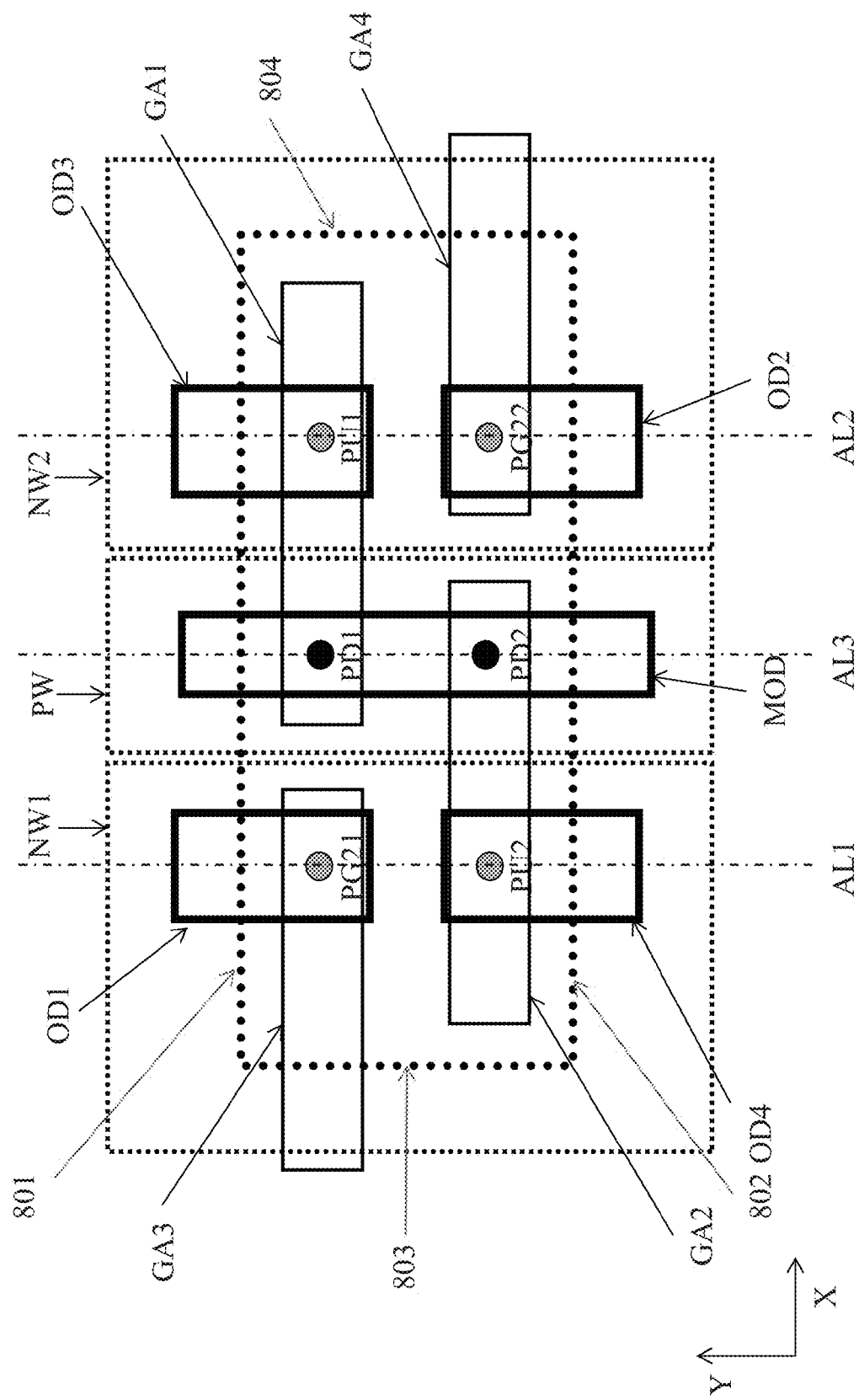
FIG. 16 is a simplified layout of the SRAM cell including source active regions, gate electrodes, and channel layers according to the embodiment illustrated in FIG. 15.

FIG. 16 is a simplified layout of the SRAM cell including source active regions by which source regions are formed, gate electrodes, and channel layers according to the embodiment illustrated in FIG. 15.

Referring to FIG. 16, the SRAM cell includes a main source active region MOD and first through fourth source active region OD1 through OD4 made of a Si-based material or a Ge-based material with silicide layers or a germanide layers disposed thereon to form bottom plates. The silicide or germanide material may be one or more of Ti, Co, Ni, Mo or Pt. The first source active region OD1 and the fourth source active region OD4 are P-type source active regions formed in the first N-type well NW1, the second source active region OD2 and the third source active region OD3 are P-type source active regions formed in the second N-type well NW2, and the main source active region MOD is an N-type source active region formed in the P-type well NW located between the first N-type well NW1 and the second N-type well NW2 in the X direction (row direction).

Source regions of the first and second pull-down transistors PD1 and PD2 are formed of the main source active region MOD and thus are electrically connected to each other through the same main source active region MOD. Source regions of the first pass-gate transistor PG21, the second pass-gate transistor PG22, the first pull-up transistor PU1, and the second pull-up transistor PU2 are formed of the first through fourth source active regions OD1 through OD4, respectively. Although not illustrated in FIG. 16, an STI is formed between adjacent source active regions.

The SRAM cell has only three aligning lines parallel to the Y direction (column direction), by which one or two of the source active regions are aligned. The aligning lines are "virtual" lines and there is no physical line in the semiconductor device. The first source active region OD1 and the fourth source active region OD4 are aligned to each other along a first aligning line AL1, the second source active region OD2 and the third source active region OD3 are aligned to each other along a second aligning line AL2, and the main source active region MOD is aligned along a third aligning line AL3 located between the first and second aligning lines AL1 and AL2. In other words, there are three source active region "line-and-space" patterns in the SRAM cell.

Referring to FIG. 16, the SRAM cell has first through fourth boundaries 801 through 804, in which the first and second boundaries 801 and 802 are parallel to the X direction while the third and fourth boundaries 803 and 804 are parallel to the Y direction. Although not illustrated, the SRAM may include a plurality of SRAM cells arranged in an array, in which the boundaries of one cell are directly aligned to the boundaries of adjacent SRAM cells. The configuration of the main source active region MOD and the first through fourth source active regions OD1 through OD4 with reference to the first through fourth boundaries 801 through 804 are the same as that described with reference to FIG. 6; therefore, the overlapped description will be omitted here.

As shown in FIG. 16, the SRAM cell includes four gate electrode layers. A first gate electrode layer GA1 acts as gate electrodes of the first pull-up transistor PU1 and the first pull-down transistor PD1. A second gate electrode layer GA2 acts as gate electrodes of the second pull-up transistor PU2 and the second pull-down transistor PD2. A third gate electrode layer GA3 acts as a gate electrode of the first pass-gate transistor PG21 and a fourth gate electrode layer GA4 acts as a gate electrode of the second pass-gate transistor PG22. The first and third gate electrode layers GA1 and GA3 are aligned to each other in the X direction, and the second and fourth gate electrode layers GA2 and GA4 are aligned to each other in the X direction.

Figure 17:
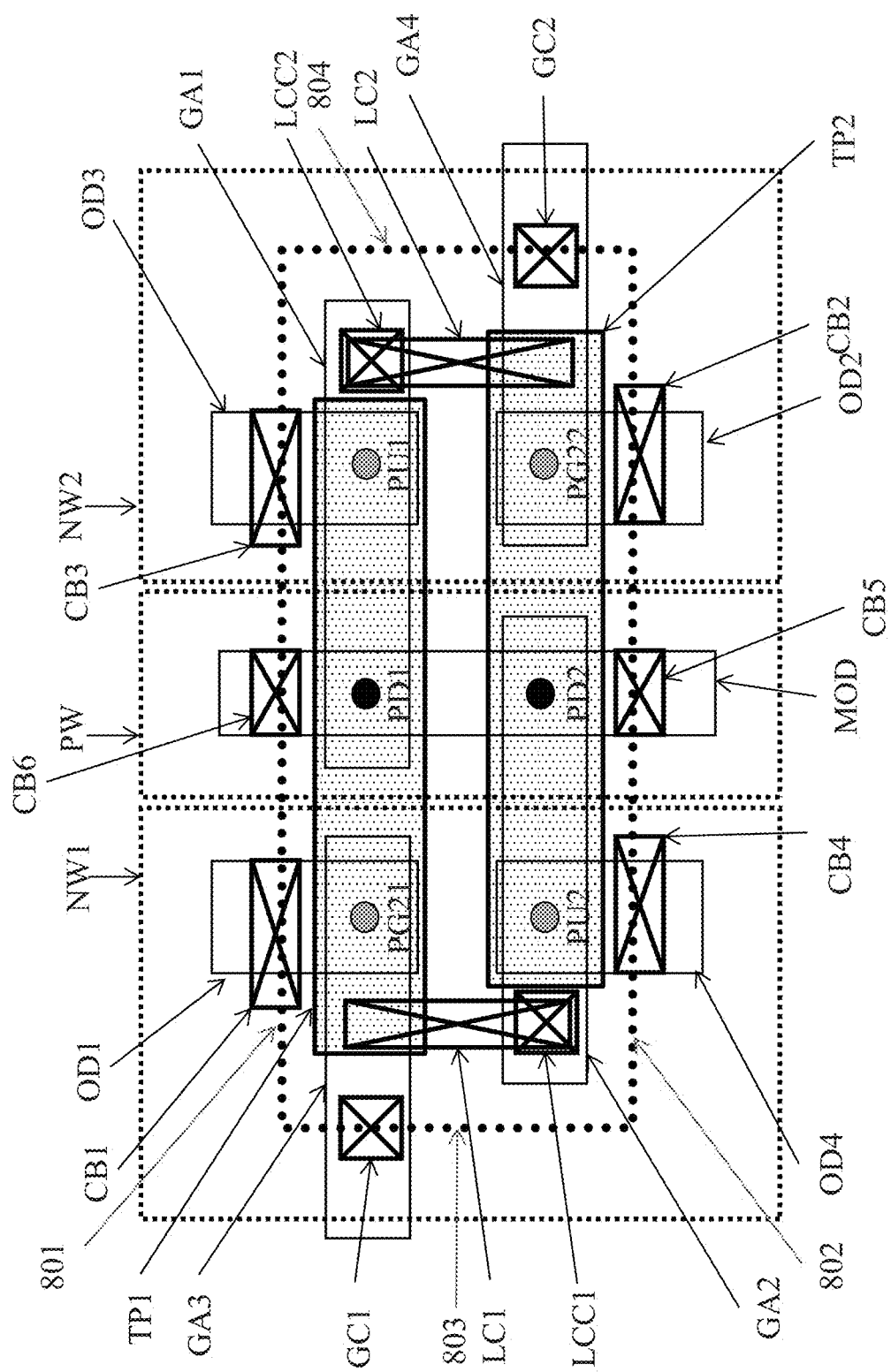
FIG. 17 is a layout of the SRAM cell of FIG. 16, additionally illustrating local connection structures and top plate layers.

FIG. 17 is a layout of the SRAM cell of FIG. 16, additionally illustrating local connection structures and top plate layers.

As shown in FIG. 17, drain regions of the first pull-up transistor PU1, the first pull-down transistor PD1, and the first pass-gate transistor PG21 are formed by a first top plate layer TP1 and drain regions of the second pull-up transistor PU2, the second pull-down transistor PD2, and the second pass-gate transistor PG22 are formed by a second top plate layer TP2. Each of the first and second top plate layers TP1 and TP2 may have a rectangular shape in a plane parallel to a major surface of the substrate on which the SRAM cell is formed. Each of the first and second top plate layers TP1 and TP2 is formed of a heavily doped semiconductor layer and may further include one or more layers of Si, Ti-base silicide, Co-base silicide, Ni-base silicide, Pt-base silicide, TiN, TaN, W, Cu or Al, or any other suitable materials formed over the heavily doped semiconductor layer.

The SRAM cell further includes a first local connection structure electrically connecting the second gate electrode layer GA2 and the first top plate layer TP1, and a second local connection structure electrically connecting the first gate electrode layer GA1 and the second top plate layer TP2. The SRAM cell also includes a first gate contact GC1 disposed on the third gate electrode layer GA3 and a second gate contact GC2 disposed on the fourth gate electrode layer GA4. In addition, the SRAM includes contact bars CB1 through CB4 extending from the first through fourth source active regions OD1 through OD4, respectively, and contact bars CB5 and CB6 extending from the main source active regions MOD. A description of the first and second local connection structures, the first and second gate contacts GC1 and GC2, and the contact bars CB1 through CB6 may be referred to the description with reference to FIG. 7. Therefore, the overlapped description will be omitted here to avoid redundancy.

Figure 18A:
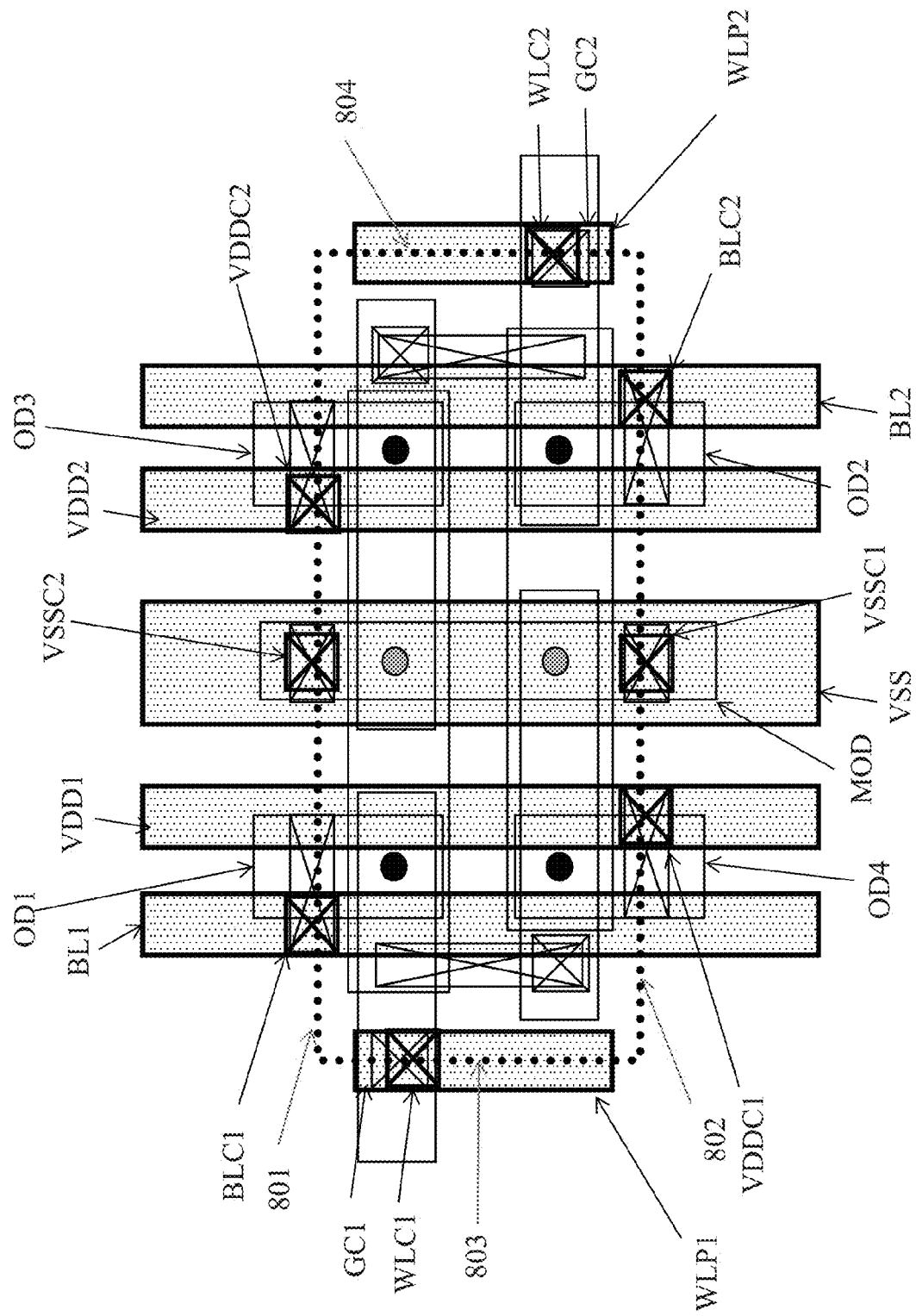
FIGS. 18A and 18B are layouts of the SRAM cell of FIG. 17, additionally illustrating metal wirings.
Figure 18B:
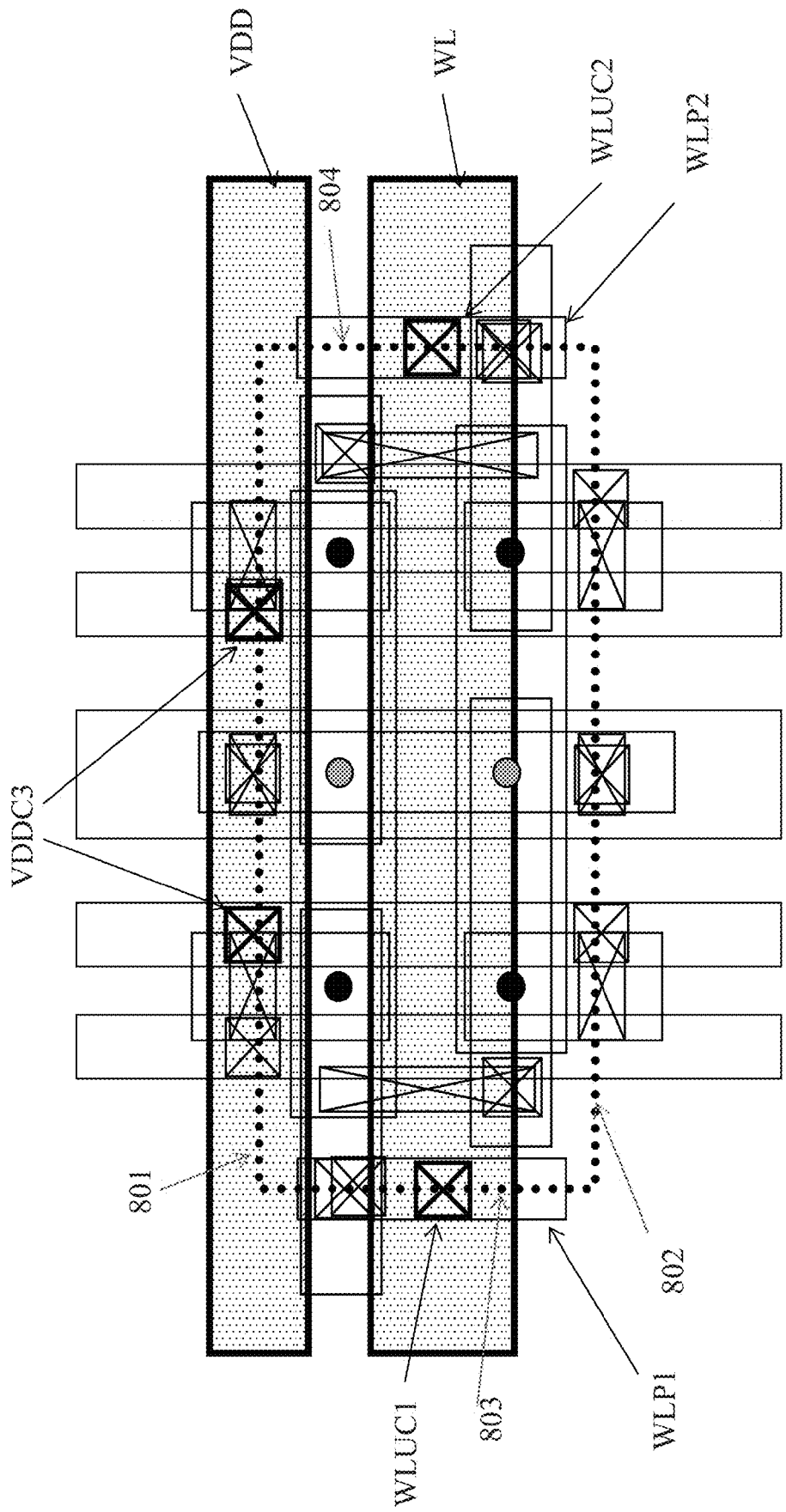

FIGS. 18A and 18B are layouts of the SRAM cell of FIG. 17, additionally illustrating metal wirings.

Referring to FIG. 18A, the SRAM cell includes a first level of metal wirings including first and second bitlines BL1 and BL2, a first power supply lines VSS, first and second auxiliary power supply lines VDD1 and VDD2, and first and second wordline plates WLP1 and WLP2. The first bitline BL1, the first auxiliary power supply line VDD1, the first power supply line VSS, the second auxiliary power supply line VDD2, and the second bitline BL2 are sequentially arranged in the X direction and each extend continuously between the first and second boundaries 801 and 802. The first and second wordline plates WLP1 and WLP2 contact neither the first boundary 801 nor the second boundary 802, and thus, the first and second wordline plates WLP1 and WLP2 are electrically isolated from the wordline plates of adjacent SRAM cells arranged in the same column of the SRAM.

Referring to FIGS. 17 and 18A, the main source active region MOD, portions of which act as the source regions of the first and second pull-down transistors PD1 and PD2, is electrically connected to the first power supply line VSS through the contact bars CB5 and CB6 and contacts VSSC1 and VSSC2 which are formed over the contact bars CB5 and CB6, respectively. The first source active region OD1 is electrically connected to the first bitline BL1 through the contact bar CB1 and contact BLC1 which is formed over the contact bar CB1. The second source active region OD2 is electrically connected to the second bitline BL2 through the contact bar CB2 and contact BLC2 which is formed over the contact bar CB2. The third source active region OD3 is electrically connected to the second auxiliary power supply line VDD2 through the contact bar CB3 and contact VDDC2 which is formed over the contact bar CB3. The fourth source active region OD4 is electrically connected to the first auxiliary power supply line VDD1 through the contact bar CB4 and contact VDDC1 which is formed over the contact bar CB4. The third gate electrode layer GA3 is electrically connected to the first wordline plate WLP1 through the first gate contact GC1 and a contact WLC1 formed over the first gate contact GC1, and the fourth gate electrode layer GA4 is electrically connected to the second wordline plate WLP2 through the second gate contact GC2 and a contact WLC2 formed over the first gate contact GC2. It should be appreciated that the contacts WLC1, WLC2, BLC1, BLC2, VSSC1, and VSSC2 may be formed of the same material and by the same manufacturing process.

Referring to FIG. 18B, the SRAM cell further includes a wordline WL and a second power supply line VDD formed of the metal wirings of the second metal layer above the metal wirings of the first metal layer. The wordline WL and the second power supply line VDD each extend continuously between the third and fourth boundaries 803 and 804.

Now referring to FIGS. 17, 18A, and 18B, the wordline WL is electrically connected to the third and fourth gate electrode layers GA3 and GA4 portions of which respectively act as the gate electrodes of the first and second pass-gate transistors PG21 and PG22, through a contact WLUC1, the first wordline plate WLP1, the contact WLC1, and the contact GC1 and through a contact WLUC2, the second wordline plate WLP2, the contact WLC2, and the contact GC2, respectively. The second power supply line VDD is connected to the third and fourth source active regions OD3 and OD4, portions of which respectively act as the source regions of the first and second pull-up transistors PU1 and PU2, through a contact VDDC3, the first auxiliary power supply line VDD1, the contact VDDC1, and the contact CB4 and through another contact VDDC3, the second auxiliary power supply line VDD2, the contact VDDC2, and the contact CB3, respectively. It should be appreciated that the contacts VDDC3, WLUC1, and WLUC2 are formed between the metal wirings of the first and second metal layers and are formed of the same material and by the same manufacturing process.

The metal wirings of the first and second metal layers are not limited to the above description with reference to FIGS. 18A and 18B, and may be modified according to other embodiments of the present disclosure. Such modifications will be more apparent with reference to FIGS. 19A and 19B which illustrate modified layouts of the SRAM cell illustrated in FIGS. 18A and 18B.

Figure 19A:
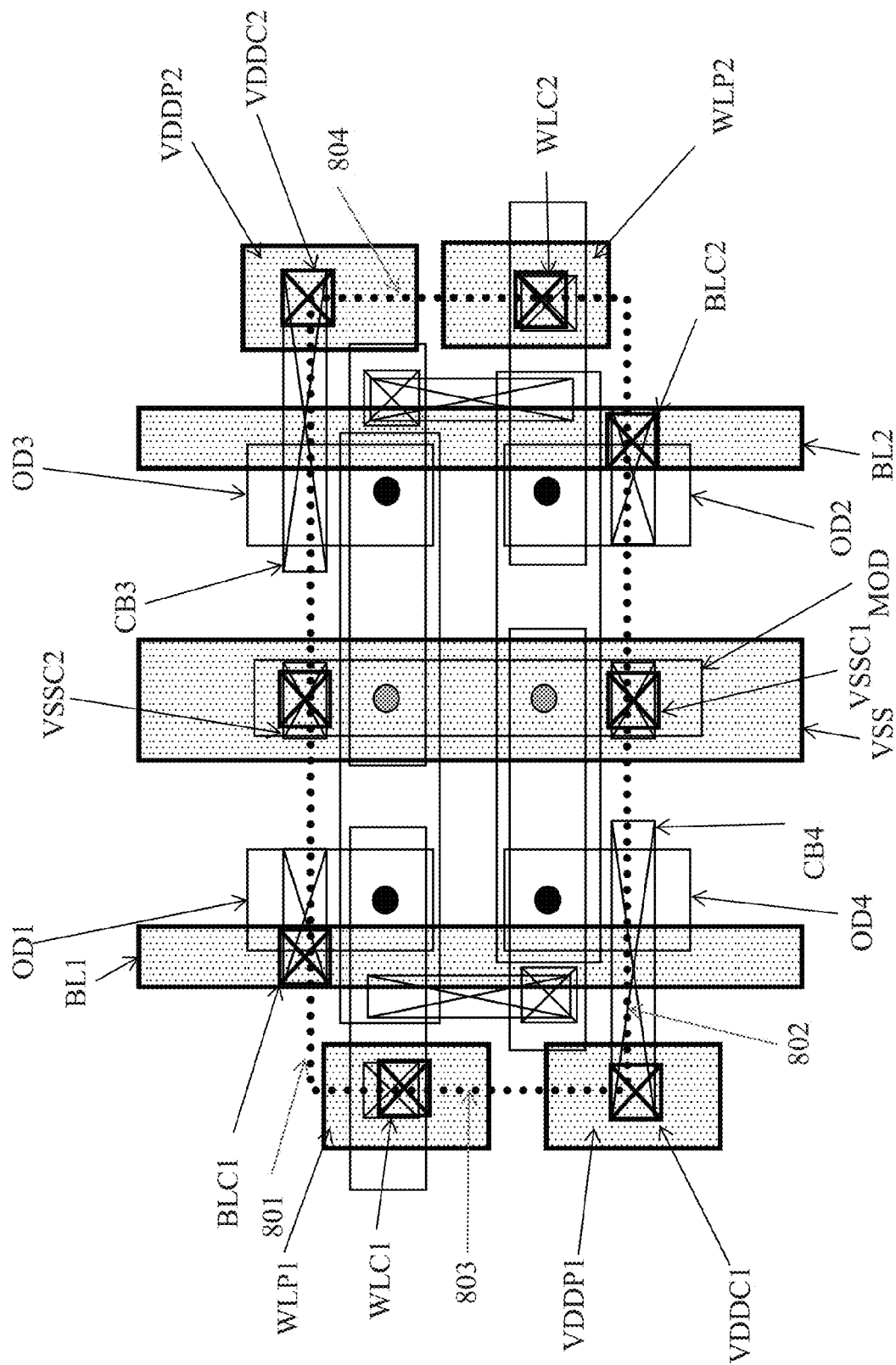
FIGS. 19A and 19B are modified layouts of the SRAM cell illustrated in FIGS. 18A and 18B.
Figure 19B:
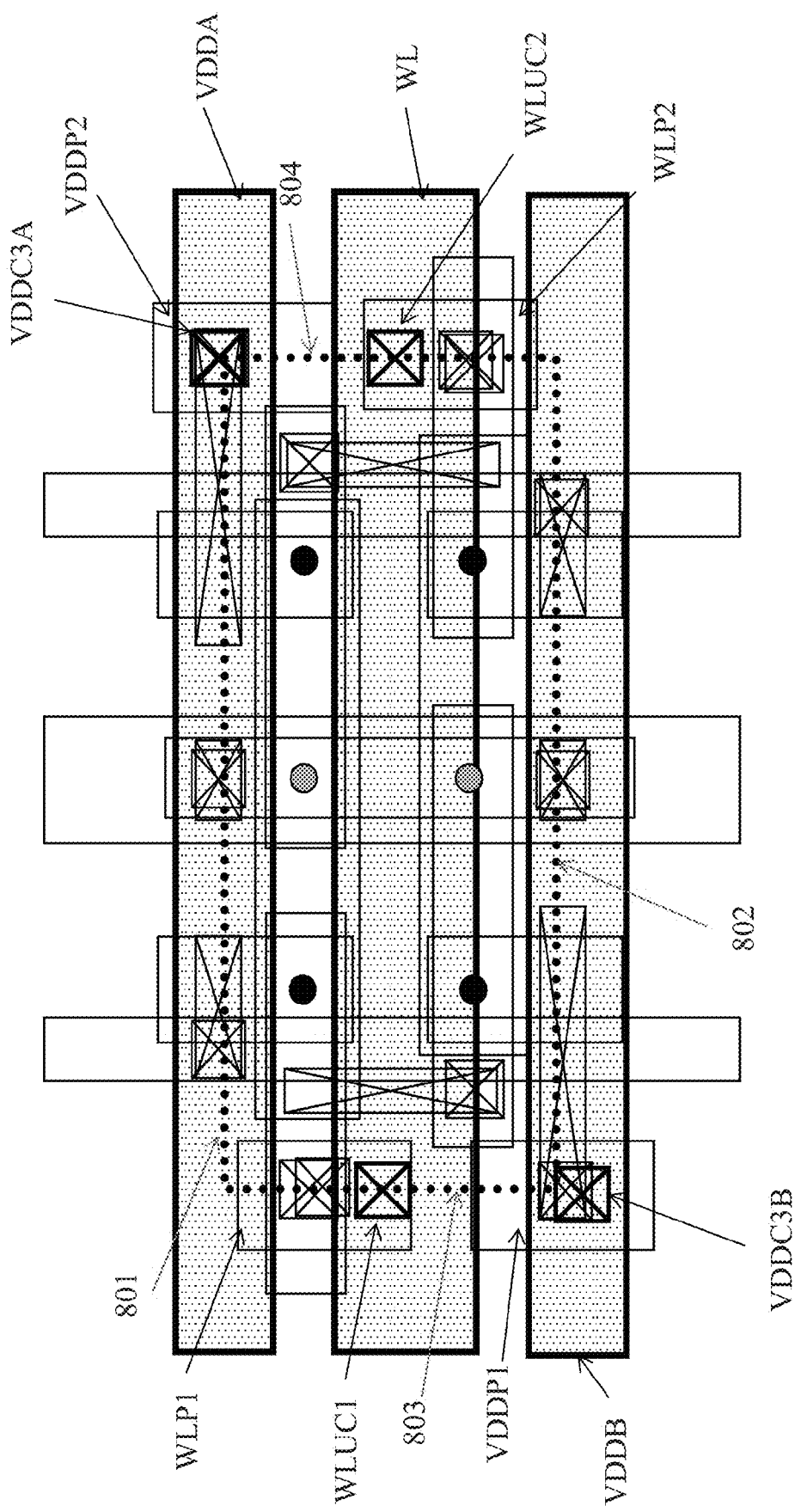

As shown in FIGS. 19A and 19B, the configuration of first and second bitlines BL1 and BL2, a first power supply line VSS, and a wordline WL and their corresponding contacts, is substantially the same as that illustrated in FIGS. 18A and 18B, except that first and second wordline plates WLP1 and WLP2 are relatively shorter than those in FIGS. 18A and 18B. To avoid redundancy, a description of the overlapped features will be omitted.

Referring to FIG. 19A, a contact bar CB4 electrically connected to the fourth source active region OD4 extends further toward the third boundary line 803. A first power line plate VDDP1 formed of the metal wirings of the first metal layer is electrically connected to the contact bar CB4 through a contact VDDC1 formed over the contact bar CB4.

The first power line plate VDDP1 may be aligned to the first wordline plate WLP1 in the Y direction. Similarly, a contact bar CB3 electrically connected to the third source active region OD3 extends further toward the fourth boundary line 804. A second power line plate VDDP2 formed of the metal wirings of the first metal layer is electrically connected to the contact bar CB3 through a contact VDDC2 formed over the contact bar CB3. The second power line plate VDDP2 may be aligned to the second wordline plate WLP2 in the Y direction. It should be appreciated that the first and second power line plate VDDP1 and VDDP2 are formed of the same material and by the same manufacturing process as the first and second bitlines BL1 and BL2, the first power supply line VDD, and the first and second wordline plates WLP1 an WLP2. It should also be appreciated that the contacts VDDC1 and VDDC2 are formed of the same material and by the same manufacturing process as the contacts WLC1, WLC2, BLC1, BLC2, VSSC1 and VSSC2.

Now turning to FIG. 19B, the SRAM cell includes a pair of second power supply lines VDDA and VDDB electrically connected to the first and second power line plates VDDP1 and VDDP2 respectively through contacts VDDC3A and VDDC3B which are formed of the same material and by the same process as the contacts WLUC1 and WLUC2.

As described above, the first power supply line VSS, which may be formed of the metal wirings of the first metal layer, is electrically connected to the main source active region MOD portions of which act as the source regions of the first and second pull-down transistors PD1 and PD2. The first and second bitlines BL1 and BL2, formed of the metal wirings of the first metal layer, is electrically connected to the first and second source active regions OD1 and OD2 portions of which respectively act as the source regions of the first and second pass-gate transistors PG21 and PG22. The wordline WL, formed of the metal wirings of the second metal layer, is electrically connected to the third and fourth gate electrode layers GA3 and GA4 which respectively act as the gate electrodes of the first and second pass-gate transistors PG21 and PG22. The second power supply line VDD, formed of the metal wirings of the second metal layer, is electrically connected to the third and fourth source active regions OD3 and OD4 portions of which act as the source regions of the first and second pull-up transistors PU1 and PU2; alternately, the pair of second power supply line VDDA and VDDB, which may be formed of the metal wirings of the second metal layer, are respectively electrically connected to third and fourth source active regions OD3 and OD4 portions of which respectively act as the source regions of the first and second pull-up transistors PU1 and PU2. The first top plate layer TP1, portions of which act as the drain regions of the first pass-gate transistor PG21, the first pull-up transistor PU1, and the first pull-down transistor PD1, is electrically connected to the second gate electrode layer GA2 which acts as the gate electrodes of the second pull-up transistor PU2 and the second pull-down transistor PD2, through the local structure formed of the first local gate contact LCC1 and the first local connection layer LC1. The second top plate layer TP2, portions of which act as the drain regions of the second pass-gate transistor PG22, the second pull-up transistor PU2, and the second pull-down transistor PD2, is electrically connected to the first gate electrode layer GA1 which acts as the gate electrodes of the first pull-up transistor PU1 and the first pull-down transistor PD1, through the local structure formed of the second local gate contact LCC2 and the second local connection layer LC2.

Figure 20:
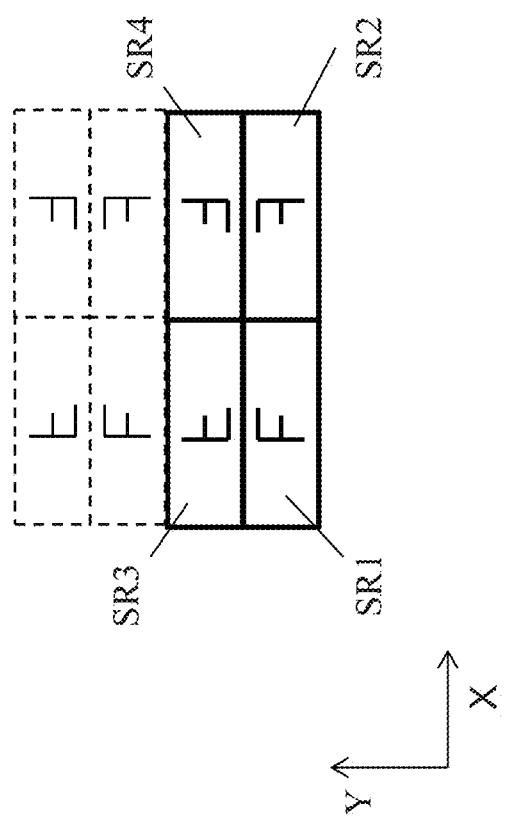
FIG. 20 is an exemplary layout of a portion of an array of SRAM cells according to an embodiment of the present disclosure.

FIG. 20 is an exemplary layout of a portion of an array of SRAM cells according to an embodiment of the present disclosure. In FIG. 20, all SRAM cells are identical to each other except that the orientation of each cell is different from that of adjacent cells. It should be appreciated that any one of the aforementioned SRAM cells may be employed in the array of the SRAM cell partially illustrated in FIG. 20.

As shown in FIG. 20, the SRAM array includes a plurality of SRAM cells, for example, first through fourth SRAM cells, SR1, SR2, SR3 and SR4. The first SRAM cell SR1 has the same layout according to the embodiments in this disclosure. The second SRAM cell SR2 has a layout which is a horizontally flipped layout of the first SRAM cell SR1 with respect to an axis parallel to the Y direction. The third SRAM cell SR3 has a layout which is a vertically flipped layout of the first SRAM cell SR1 with respect to an axis parallel to the X direction. The fourth SRAM cell SR4 has a layout which is a horizontally flipped layout of the third SRAM cell SR3 with respect to an axis parallel to the Y direction. Along the column direction (Y), plural first SRAM cells SR1 and plural third SRAM cells SR3 are alternatively arranged.

Figure 21:
FIG. 21 shows a flowchart of a method for manufacturing an SRAM array according to an embodiment of the present disclosure.

FIG. 21 shows a flowchart of a method for manufacturing an SRAM array according to an embodiment of the present disclosure. It is understood that additional steps can be provided before, during, and after various steps illustrated by FIG. 21, and some of the steps described below can be replaced or eliminated. The order of the operations/steps may be interchangeable.

In S210, P-type wells and N-type wells having the foregoing layout, configuration and structures are formed in the substrate. In S220, source active regions, e.g., the main active region MOD and the first through fourth active regions OD1 through OD4, having the foregoing layout, configuration and structures, together with corresponding silicide layers are formed in the top portions of the wells. It should be appreciated that any portions of the same continuous source active region are formed simultaneously. In S230, various layers, such as channel layers, gate electrode layers, and gate insulating layers, of transistors, having the foregoing layout, configuration and structures, are formed over the substrate. In S240, drain regions (top plates) having the foregoing layout, configuration and structures are formed over the various layers of the transistors. In S250, contacts, such as contact bars, gate contacts, local connects, and plate contacts, having the foregoing layout, configuration and structures, are formed. In S260, the first vias in the first vial level and first level metal wirings in the first metal layer level, having the foregoing layout, configuration and structures, are formed. In S270, the second vias in the second via level and second level metal wirings in the second metal layer level, having the foregoing layout, configuration and structures, are formed.

In accordance with one aspect of the present disclosure, a static random access memory (SRAM) cell is defined by first and second boundaries disposed opposite to each other and third and fourth boundaries disposed opposite to each other and intersected by the first and second boundaries. The SRAM cell includes a first invertor including a first P-type pull-up transistor and a first N-type pull-down transistor, a second invertor including a second P-type pull-up transistor and a second N-type pull-down transistor and cross-coupled to the first invertor, and first and second pass-gate transistors connected to the cross-coupled first and second invertors. Source regions of the first and second P-type pull-up transistors are formed by a main source active region extending continuously between the first and second boundaries. Source regions of the first and second pass-gate transistors and the first and second N-type pull-down transistors are formed by different source active regions spaced apart from each other.

In accordance with another aspect of the present disclosure, a static random access memory (SRAM) cell is defined by first and second boundaries disposed opposite to each other and third and fourth boundaries disposed opposite to each other and intersected by the first and second boundaries. The SRAM cell includes a first invertor including a first P-type pull-up transistor and a first N-type pull-down transistor, a second invertor including a second P-type pull-up transistor and a second N-type pull-down transistor and cross-coupled to the first invertor, and first and second pass-gate transistors connected to the cross-coupled first and second invertors. Source regions of the first and second N-type pull-down transistors are formed by a main source active region extending continuously between the first and second boundaries. Source regions of the first and second pass-gate transistors and the first and second P-type pull-up transistors are formed by different source active regions spaced apart from each other.

In accordance with another aspect of the present disclosure, a static random access memory (SRAM) cell is defined by first and second boundaries disposed opposite to each other and third and fourth boundaries disposed opposite to each other and intersected by the first and second boundaries. The SRAM cell includes a first invertor including a first pull-up transistor and a first pull-down transistor, a second invertor including a second pull-up transistor and a second pull-down transistor and cross-coupled to the first invertor, and first and second pass-gate transistors connected to the cross-coupled first and second invertors. Two of the first and second pull-up transistors, the first and second pull-down transistors, and the first and second pass-gate transistors are first type transistors. Four of the first and second pull-up transistors, the first and second pull-down transistors, and the first and second pass-gate transistors are second type transistors. Source regions of the two first type transistors are formed by a main source active region extending continuously between the first and second boundaries. Source regions of the four second type transistors are formed by different source active regions spaced apart from each other.

The various embodiments or examples described herein offer several advantages over the existing art. For example, in the present disclosure, since the SRAM cell having VGAA FET devices has only three aligning lines on which one or two of the source active regions are aligned. Accordingly, the size of the SRAM cell can be reduced. In addition, since the source active regions have a simple rectangular pattern, pattern fidelities and the process margins in patterning operations such as lithography and etching can be improved. Moreover, since one of the source active regions (MOD) and one of the first metal lines (VDD or VSS) are used to provide a predetermined potential when the SRAM is operating, it is also possible to reduce the SRAM cell size. Moreover, by using a VGAA FET device, an area of the SRAM cell can be reduced and to more effectively control short channel effects, thereby realizing a lower power operation. It is also possible to more flexibly design the SRAM array.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) including a plurality of SRAM cells arranged in a first direction, each of the plurality of SRAM cells comprising:
 a first inverter and a second inverter;
 a first pass-gate transistor electrically coupled to an output of the first inverter and an input of the second inverter; and
 a second pass-gate transistor electrically coupled to an output of the second inverter and an input of the first inverter, wherein:
 the first inverter includes a first first-type transistor and a first second-type transistor,
 the second inverter includes a second first-type transistor and a second second-type transistor,
 the first pass-gate transistor and the second pass-gate transistor are second-type transistors,
 each of the plurality of SRAM cells further comprises a main active region, a first active region, a second active region, a third active region, and a fourth active region,
 the main active region being electrically coupled to the first first-type transistor and the second first-type transistor,
 the first active region being electrically coupled to the first pass-gate transistor,
 the second active region being electrically coupled to the second pass-gate transistor,
 the third active region being electrically coupled to the first second-type transistor, and
 the fourth active region being electrically coupled to the second second-type transistor, and
 each of the plurality of SRAM cells further comprises a first first-type well, a second first-type well, and a second-type well,
 the first active region and the fourth active region being formed in the first first-type well,
 the second active region and the third active region being formed in the second first-type well,
 the main active region being formed in the second-type well, and
 the second-type well is located between the first first-type well and the second first-type well along a second direction perpendicular to the first direction.

2. The SRAM of claim 1, wherein each of the first pass-gate transistor, the second pass-gate transistor, the first first-type transistor, the first second-type transistor, the second first-type transistor, and the second second-type transistor is a vertical field-effect transistor.

3. The SRAM of claim 1, wherein:
 the first active regions and the fourth active regions of the plurality of SRAM cells are aligned on a first aligning line,
 the second active region and the third active region of the plurality of SRAM cells are aligned on a second aligning line,
 the main active regions of the plurality of SRAM cells are aligned on a third aligning line, and the first through third aligning lines are parallel to the first direction.

4. The SRAM of claim 1, wherein each of the plurality of SRAM cells further comprises:
a first gate layer connecting a gate of the first first-type transistor and a gate of the first second-type transistor, the first gate layer being the output of the first inverter;
a second gate layer connecting a gate of the second first-type transistor and a gate of the second second-type transistor, the second gate layer being the output of the second inverter;
a third gate layer coupled to a gate of the first pass-gate transistor; and
a fourth gate layer coupled to a gate of the second pass-gate transistor.

5. The SRAM of claim 4, wherein each of the plurality of SRAM cells further comprises:
a first top plate layer coupled to drains of the first first-type transistor, the first second-type transistor, and the first pass-gate transistor; and
a second top plate layer coupled to drains of the second first-type transistor, the second second-type transistor, and the second pass-gate transistor.

6. The SRAM of claim 5, wherein each of the plurality of SRAM cells further comprises:
a first local connection layer electrically coupled to the second gate layer and the first top plate layer; and
a second local connection layer electrically coupled to the first gate layer and the second top plate layer.

7. The SRAM of claim 1, further comprising:
a first power line electrically coupled to the main active regions of the plurality of SRAM cells;
a second power line electrically isolated from the first power line and electrically coupled to the third and fourth active regions of the plurality of SRAM cells;
a first bit line electrically coupled to the first pass-gate transistors of the plurality of the SRAM cells;
a second bit line electrically coupled to the second-pass gate transistors of the plurality of the SRAM cells; and
a plurality of word lines each electrically coupled to the gate of the first pass-gate transistor and the gate of the second pass-gate transistor of a respective one of the plurality of SRAM cells, wherein:
the first power line, the second power line, the first bit line, and the second bit line are located at a first level metal layer, and
the plurality of word lines are located at a second level metal layer above the first level metal layer.

8. The SRAM of claim 1, further comprising:
a first power line electrically coupled to the main active regions of the plurality of SRAM cells;
a second power line electrically isolated from the first power line and electrically coupled to the third and fourth active regions of the plurality of SRAM cells;
a first bit line electrically coupled to the first pass-gate transistors of the plurality of the SRAM cells;
a second bit line electrically coupled to the second-pass gate transistors of the plurality of the SRAM cells; and
a plurality of word lines each electrically coupled to the gate of the first pass-gate transistor and the gate of the second pass-gate transistor of a respective one of the plurality of SRAM cells, wherein:
the first power line, the first bit line, and the second bit line are located at a first level metal layer, and
the second power line and the plurality of word lines are located at a second level metal layer above the first level metal layer.

9. A static random access memory (SRAM) including a plurality of SRAM cells arranged in a first direction, each of the plurality of SRAM cells comprising:
a first inverter and a second inverter;
a first pass-gate transistor electrically coupled to an output of the first inverter and an input of the second inverter; and
a second pass-gate transistor electrically coupled to an output of the second inverter and an input of the first inverter, wherein:
the first inverter includes a first first-type transistor and a first second-type transistor,
the second inverter includes a second first-type transistor and a second second-type transistor,
each of the plurality of SRAM cells further comprises a main active region, a first active region, a second active region, a third active region, and a fourth active region,
the main active region being electrically coupled to the first first-type transistor and the second first-type transistor,
the first active region being electrically coupled to the first pass-gate transistor,
the second active region being electrically coupled to the second pass-gate transistor,
the third active region being electrically coupled to the second second-type transistor, and
the fourth active region being electrically coupled to the first second-type transistor, and
each of the plurality of SRAM cells further comprises a first first-type well, a second first-type well, and a second-type well,
the first active region and the fourth active region being formed in the first first-type well,
the second active region and the third active region being formed in the second first-type well,
the main active region being formed in the second-type well, and
the second-type well is located between the first first-type well and the second first-type well along a second direction perpendicular to the first direction.

10. The SRAM of claim 9, wherein each of the first pass-gate transistor, the second pass-gate transistor, the first first-type transistor, the first second-type transistor, the second first-type transistor and the second second-type transistor is a vertical field-effect transistor.

11. The SRAM of claim 9, wherein:
the first active region and the fourth active region are aligned on a first aligning line,
the second active region and the third active region are aligned on a second aligning line,
the main active region is aligned on a third aligning line, and
the first through third aligning lines are parallel to the first direction.

12. The SRAM of claim 9, wherein each of the plurality of SRAM cells further comprises:
a first gate layer connecting a gate of the second first-type transistor and a gate of the second second-type transistor, the second gate layer being the output of the second inverter;
a second gate layer connecting a gate of the first first-type transistor and a gate of the first second-type transistor, the first gate layer being the output of the first inverter;
a third gate layer coupled to a gate of the first pass-gate transistor; and
a fourth gate layer coupled to a gate of the second pass-gate transistor.

13. The SRAM of claim 12, wherein each of the plurality of SRAM cells further comprises:
a first top plate layer coupled to drains of the first first-type transistor, the first second-type transistor, and the first pass-gate transistor; and
a second top plate layer coupled to drains of the second first-type transistor, the second second-type transistor, and the second pass-gate transistor.

14. The SRAM of claim 9, further comprising:
a first power line electrically coupled to the main active regions of the plurality of SRAM cells;
a second power line electrically isolated from the first power line and electrically coupled to the third and fourth active regions of the plurality of SRAM cells;
a first bit line electrically coupled to the first pass-gate transistors of the plurality of SRAM cells;
a second bit line electrically coupled to the second-pass gate transistors of the plurality of SRAM cells; and
a plurality of word lines each electrically coupled to the gate of the first pass-gate transistor and the gate of the second pass-gate transistor of a respective one of the plurality of SRAM cells, wherein:
the first power line, the second power line, the first bit line, and the second bit line are located at a first level metal layer, and
the plurality of word lines are located at a second level metal layer above the first level metal layer.

15. A static random access memory (SRAM) including a plurality of SRAM cells arranged in a first direction, each of the plurality of SRAM cells comprising:
a first inverter and a second inverter;
a first pass-gate transistor electrically coupled to an output of the first inverter and an input of the second inverter; and
a second pass-gate transistor electrically coupled to an output of the second inverter and an input of the first inverter, wherein:
the first inverter includes a first first-type transistor and a first second-type transistor,
the second inverter includes a second first-type transistor and a second second-type transistor,
each of the plurality of SRAM cells further comprises a main active region, a first active region, a second active region, a third active region, and a fourth active region,
the main active region being electrically coupled to the first second-type transistor and the second second-type transistor,
the first active region being electrically coupled to the first pass-gate transistor,
the second active region being electrically coupled to the second pass-gate transistor,
the third active region being electrically coupled to the first first-type transistor, and
the fourth active region being electrically coupled to the second first-type transistor, and
each of the plurality of SRAM cells further comprises a first-type well, a first second-type well, and a second second-type well,
the first active region and the fourth active region being formed in the first second-type well,
the second active region and the third active region being formed in the second second-type well,
the main active region being formed in the first-type well, and
the first-type well is located between the first second-type well and the second second-type well along a second direction perpendicular to the first direction.

16. The SRAM of claim 15, wherein each of the first pass-gate transistor, the second pass-gate transistor, the first first-type transistor, the first second-type transistor, the second first-type transistor, and the second second-type transistor is a vertical field-effect transistor.

17. The SRAM of claim 15, wherein:
the first active region and the fourth active region are aligned on a first aligning line,
the second active region and the third active region are aligned on a second aligning line,
the main active region is aligned on a third aligning line, and
the first through third aligning lines are parallel to the first direction.

18. The SRAM of claim 15, wherein each of the plurality of SRAM cells further comprises:
a first gate layer connecting a gate of the first first-type transistor and a gate of the first second-type transistor, the first gate layer being the output of the first inverter;
a second gate layer connecting a gate of the second first-type transistor and a gate of the second second-type transistor, the second gate layer being the output of the second inverter;
a third gate layer coupled to a gate of the first pass-gate transistor; and
a fourth gate layer coupled to a gate of the second pass-gate transistor.

19. The SRAM of claim 18, wherein each of the plurality of SRAM cells further comprises:
a first top plate layer coupled to drains of the first first-type transistor, the first second-type transistor, and the first pass-gate transistor; and
a second top plate layer coupled to drains of the second first-type transistor, the second second-type transistor, and the second pass-gate transistor.

20. The SRAM of claim 19, wherein each of the plurality of SRAM cells further comprises:
a first local connection layer electrically coupled to the second gate layer and the first top plate layer; and
a second local connection layer electrically coupled to the first gate layer and the second top plate layer.

* * * * *